(12) United States Patent
Oishi et al.

(10) Patent No.: US 8,312,400 B2
(45) Date of Patent: *Nov. 13, 2012

(54) VERIFICATION SUPPORTING SYSTEM

(75) Inventors: Ryosuke Oishi, Kawasaki (JP); Akio Matsuda, Kawasaki (JP); Koichiro Takayama, Kawasaki (JP); Tsuneo Nakata, Kawasaki (JP)

(73) Assignee: Fujitsu Limited, Kawasaki (JP)

(*) Notice: Subject to any disclaimer, the term of this patent is extended or adjusted under 35 U.S.C. 154(b) by 0 days.

This patent is subject to a terminal disclaimer.

(21) Appl. No.: 13/157,534

(22) Filed: Jun. 10, 2011

(65) Prior Publication Data

US 2011/0239172 A1 Sep. 29, 2011

Related U.S. Application Data

(62) Division of application No. 12/359,105, filed on Jan. 23, 2009, now Pat. No. 7,984,403.

(30) Foreign Application Priority Data

| May 19, 2008 | (JP) | 2008-131204 |
|---|---|---|
| Aug. 4, 2008 | (JP) | 2008-200609 |

(51) Int. Cl.
*G06F 17/50* (2006.01)

(52) U.S. Cl. ........ 716/106; 716/101; 716/102; 716/103; 716/104; 716/111; 716/132; 716/136; 703/13; 703/14

(58) Field of Classification Search .......... 716/101, 716/102, 103, 104, 106, 111, 132, 136; 703/13, 703/14

See application file for complete search history.

(56) References Cited

U.S. PATENT DOCUMENTS

| 3,725,869 | A | * | 4/1973 | Sokoloff | 708/490 |
|---|---|---|---|---|---|
| 5,511,003 | A | | 4/1996 | Agarwal | |
| 5,909,404 | A | * | 6/1999 | Schwarz | 365/201 |
| 6,721,937 | B2 | * | 4/2004 | Chard et al. | 716/102 |
| 7,013,376 | B2 | | 3/2006 | Hooper | |
| 7,017,043 | B1 | | 3/2006 | Potkonjak | |
| 7,119,577 | B2 | * | 10/2006 | Sharangpani | 326/46 |
| 7,266,791 | B2 | | 9/2007 | Morishita et al. | |

(Continued)

FOREIGN PATENT DOCUMENTS

JP      A 2006-190209      7/2006

(Continued)

OTHER PUBLICATIONS

Boubezari et al.; "Testability analysis and test-point insertion in RTL VHDL specifications for scan-based BIST"; Publication Year: 1999; Computer-Aided Design of Integrated Circuits and Systems, IEEE Transactions on; vol. 18 , Issue: 9; pp. 1327-1340.

(Continued)

*Primary Examiner* — Helen Rossoshek
(74) *Attorney, Agent, or Firm* — Greer, Burns & Crain, Ltd.

(57) ABSTRACT

A verification target register to be verified is specified from a configuration of a verification target circuit, and patterns requiring verification are extracted as a coverage standard with regard to the specified verification target register. When the patterns are extracted, a DIRW matrix is prepared to indicate possibly occurring state transitions among four states Declare, Initialize, Read, and Write in the register included in the verification target circuit, and used to decide two coverage standards, a matrix coverage standard and an implementation coverage standard.

3 Claims, 29 Drawing Sheets

U.S. PATENT DOCUMENTS

| | | |
|---|---|---|
| 7,392,492 B2 | 6/2008 | Hong et al. |
| 7,412,677 B1 * | 8/2008 | Manohararajah et al. .... 716/132 |
| 7,506,286 B2 * | 3/2009 | Beardslee et al. ............ 716/136 |
| 7,509,599 B1 * | 3/2009 | Koelbl et al. ................. 716/103 |
| 7,565,631 B1 | 7/2009 | Banerjee et al. |
| 7,761,281 B2 | 7/2010 | Bankes |
| 7,822,591 B2 | 10/2010 | Otsuki et al. |
| 8,015,519 B2 * | 9/2011 | Matsuda et al. .............. 716/106 |
| 2003/0046660 A1 * | 3/2003 | Watanabe ..................... 717/106 |
| 2006/0155521 A1 | 7/2006 | Iwashita |
| 2006/0190861 A1 | 8/2006 | Matsuura |
| 2006/0200720 A1 | 9/2006 | Grimme et al. |
| 2007/0283231 A1 * | 12/2007 | Hoyle ........................... 714/781 |
| 2008/0098336 A1 * | 4/2008 | Tanimoto et al. ................. 716/3 |
| 2008/0263487 A1 | 10/2008 | Hong et al. |
| 2009/0144595 A1 | 6/2009 | Reohr et al. |
| 2009/0276740 A1 | 11/2009 | Matsuda et al. |
| 2009/0319245 A1 | 12/2009 | Ivchenko et al. |
| 2011/0231464 A1 * | 9/2011 | Rivoir ........................... 708/232 |
| 2011/0293062 A1 * | 12/2011 | Lablans ......................... 377/28 |

FOREIGN PATENT DOCUMENTS

| | | |
|---|---|---|
| JP | A 2006-201980 | 8/2006 |

OTHER PUBLICATIONS

Harry D. Foster, et al., "Programming Code metrics," Assertion-Based Design, $2^{nd}$ Edition, pp. 129-130, 2004.

Yusuke Matsunaga, "Basic techniques for high-level synthesis," Proceedings of the Society Conference of IEICE, Sep. 2003.

* cited by examiner

|  |  | after | | |
|---|---|---|---|---|
|  |  | Initialize | Read | Write |
| before | Declare | $\alpha$ | $\gamma$ | $\beta$ |
|  | Initialize | $\alpha$ | $\alpha$ | $\alpha$ |
|  | Read | $\alpha$ | $\alpha$ | $\alpha$ |
|  | Write | $\beta$ | $\alpha$ | $\beta$ |

|  |  | after | | |
|---|---|---|---|---|
|  |  | Initialize | Read | Write |
| brefore | Declare | $\alpha$ | $\gamma$ | $\beta$ |
|  | Initialize | $\alpha$ | $\alpha$ | $\alpha$ |
|  | Read | $\alpha$ | $\alpha$ | $\alpha$ |
|  | Write | $\beta$ | $\alpha$ | $\beta$ |

| | | after | | |
|---|---|---|---|---|
| | | Initialize | Read | Write |
| before | Declare | α IMPLEMENTED | γ NOT IMPLEMENTED | β NOT IMPLEMENTED |
| | Initialize | α NOT IMPLEMENTED | α IMPLEMENTED | α IMPLEMENTED |
| | Read | α NOT IMPLEMENTED | α NOT IMPLEMENTED | α NOT IMPLEMENTED |
| | Write | β NOT IMPLEMENTED | α NOT IMPLEMENTED | β IMPLEMENTED |

FIG.8

```
SPECIFICATION                                                                          ~800
<CALCULATING AREA OF TRIANGLE OR SUM OF THREE SIDES OF TRIANGLE>
√ SELECT IS MADE BETWEEN INPUT OF THREE SIDES A, B, AND C OF A TRIANGLE AND AREA OF THE TRIANGLE AND INPUT OF SUM OF
   THE THREE SIDES PARAMETERS p1, p2
√ FUNCTION S(a, b, c) IS USED TO CALCULATE AN AREA t
√ SUM OF THREE SIDES IS EXPRESSED AS L
√ SELECTION IS MADE BETWEEN OUTPUT OF AREA t AND OUTPUT OF SUM OF THREE SIDES L TO ENTER TEXT RESULT d
√ AFTER INPUT OF a, b, c, p1, AND p2, START SIGNAL IS SET TO START CALCULATION
√ CALCULATION RESULT ENTERS OUTPUT D AND finish SIGNAL IS OUTPUT
```

VERIFICATION SCENARIO
- RESET
- ASSIGN SIDE a TO REGISTER r1
- ASSIGN SIDE b TO REGISTER r2
- ASSIGN SIDE c TO REGISTER r3
- ASSIGN PARAMETER p1 TO REGISTER r4
- ASSIGN PARAMETER p2 TO REGISTER r5
- SET start SIGNAL AT 1
- WAIT FOR finish SIGNAL
- UPON RECEIPT OF finish SIGNAL, READ RESULT d FROM REGISTER r6

| REGISTER NAME | TYPE | Read/Write | MINIMUM VALUE | MAXIMUM VALUE | TYPICAL VALUE | CONSTRAINT CONDITION |
|---|---|---|---|---|---|---|
| r1 | byte | W | 1 | 255 | 127 | USE OF EVEN VALUE |
| r2 | byte | W | 1 | 255 | 127 | NOTHING |
| r3 | byte | W | 1 | 255 | 127 | USE OF ODD VALUE |
| r4 | bool | W | 0 | 1 | 1 | NOTHING |
| r5 | bool | W | 0 | 1 | 1 | NOTHING |
| t | byte | – | 0 | 255 | – | NOTHING |
| L | byte | – | 0 | 255 | – | NOTHING |
| r6 | byte | R | 1 | 255 | – | NOTHING |

```
// $Date: 2007-11-14 17:35:35+09 $
`timescale 1ps/1ps module cdfg
(
    CLK, RST, a, b, c, d, p1, p2, start, finish
);

input CLK;
    input RST;
    input [7:0] a;
    input [7:0] b;
    input [7:0] c;
    input [7:0] p1;
    input [7:0] p2;
    output [7:0] d;
    input        start;
    output       finish;

reg [7:0]    r1;
    reg [7:0]    r2;
    reg [7:0]    r3;
    reg          r4;
    reg          r5;
    reg [7:0]    r6;

reg [7:0]    t;           ⎫
    reg [7:0]    L;           ⎬ 1101
                              ⎪
    reg          flag1;       ⎪
    reg          flag2;       ⎪
    reg          flag3;       ⎪
    reg          flag4;       ⎪
    reg          flag5;       ⎭
    wire         S;

assign    a=r1;
    assign    b=r2;
    assign    c=r3;
    assign    p1=r4;
    assign    p2=r5;
    assign    d=r6;
    assign    start=flag1;
    assign    finish=flag5;
```

```
// reset
always @(posedge CLK or negedge RST)
begin
    if (~RST) begin
        t <=0;
    end
end // start flag transition
always @(posedge CLK) begin   ←1102
    flag2 <= flag1;
    flag3 <= flag2;
    flag4 <= flag3;
    flag5 <= flag4;    //output as finish
end always @(posedge flag1) begin
    t <= 0;   ←1103
end always @(posedge flag2)begin
    if(r4==0) t <= S;   ←1104
    else L <= (r1 + r2) + r3;   ←1105
end always @(posedge flag3)begin
    if(r5==0) r6 <= t;   ←1106
    else L <= ;t   ←1107
end always @(posedge flag4) begin
    if(r5==1) r6 <= t;   ←1108
end // Area calculator unit (combinational circuit)
TriangleArea TriangleArea
(
    .CLK (CLK),
    .edge1 (r1),
    .edge2 (r2),
    .edge3 (r3),
    .area (S)
);

endmodule
```

FIG.20

| No. | TRANSITION | EVALUATION | IMPLEMENTATION | ASSERTION |
|---|---|---|---|---|
| 0 | D→I | α | yes | assert always··· |
| 1 | D→R | γ | | |
| 2 | D→W | β | | |
| 3 | I→I | α | | |
| 4 | I→R | α | yes | ··· |
| 5 | I→W | α | yes | ··· / ··· |
| 6 | R→I | α | | |
| 7 | R→R | α | | |
| 8 | R→W | α | | |
| 9 | W→I | β | | |
| 10 | W→R | α | | |
| 11 | W→W | β | yes | ··· / ··· |

FIG.21

| No. | TRANSITION | EVALUATION | IMPLEMENTATION | ASSERTION |
|---|---|---|---|---|
| 0 | D→I | α | yes | assert always··· |
| 1 | D→R | γ | | |
| 2 | D→W | β | | |
| 3 | I→I | α | | |
| 4 | I→R | α | yes | ··· |
| 5 | I→W | α | yes | ··· / ··· |
| 6 | R→I | α | | |
| 7 | R→R | α | | |
| 8 | R→W | α | | |
| 9 | W→I | β | | |
| 10 | W→R | α | | |
| 11 | W→W | β | yes | ··· / ··· |

FIG.22

| No. | TRANSITION | EVALUATION | IMPLEMENTATION | ASSERTION |
|---|---|---|---|---|
| 0 | D→I | α | yes | assert always... |
| 1 | D→R | γ | | |
| 2 | D→W | β | | |
| 3 | I→I | α | | |
| 4 | I→R | α | yes | ... |
| 5 | I→W | α | yes | ... |
| 6 | R→I | α | | |
| 7 | R→R | α | | |
| 8 | R→W | α | | |
| 9 | W→I | β | | |
| 10 | W→R | α | | |
| 11 | W→W | β | yes | ... |

FIG.23

VERIFICATION SCENARIO
· RESET
· ASSIGN SIDE a TO REGISTER r1
· ASSIGN SIDE b TO REGISTER r2
· ASSIGN SIDE c TO REGISTER r3
· ASSIGN PARAMETER p1 TO REGISTER r4
· ASSIGN PARAMETER p2 TO REGISTER r5
· SET start SIGNAL AT 1
· WAIT FOR finish SIGNAL
· UPON RECEIPT OF finish SIGNAL, READ RESULT d FROM REGISTER r6

FIG.24

```
// $Date: 2007-11-14 17:34:20+09 $
`timescale 1ps/1ps module cdfg
(
CLK, RST, a, b, c, d, p1, p2, start, finish
);

input CLK;
 input RST;
 input [7:0] a;
 input [7:0] b;
 input [7:0] c;
 input [7:0] p1;
 input [7:0] p2;
 output [7:0] d;
 input     start;
 output    finish;

reg [7:0]  r1;
 reg [7:0]  r2;
 reg [7:0]  r3;
 reg        r4;
 reg        r5;
 reg [7:0]  r6;

reg [7:0]  t;
 reg [7:0]  L;

wire [8:0] S;

reg [3:0]  state;
 reg        _finish;

assign  a=1r;
 assign  b=r2;
 assign  c=r3;
 assign  p1=r4;
 assign  p2=r5;
 assign  d=r6;
```

```
// reset
always @(posedge CLK or negedge RST) begin
    if (~RST) begin
        t <=0;
        state <= 0;
        _finish <= 0;
    end
end
// if calculation has not finished, output no signal
always @(posedge CLK) begin
    if(state < 3) _finish <= 0;
end always @(posedge CLK) begin          ~2401
    if(start == 0) state <=0;
    else begin
    case(state)
        0:
        begin
            state <=1;         ~2402
            if(p1==0) t <= 0;        ~2403
            else L <= (r1 + r2) + r3;
        end
        1:
        begin
            state <=2;
            if(p2==0) r6 <= t;    ~2404
        end
        2:
        begin
            state <=3;          ~2405
            if(p2==1) t <= L;
        end
        3:
        begin
            state <=4;
            _finish <=1;
        end
    endcase
    end
end // always @ (posedge CLK and posedge start)
endmodule
```

| No. | TRANSITION | EVALUATION | IMPLEMENTATION | ASSERTION |
|---|---|---|---|---|
| 0 | D→I | α | yes | assert always··· |
| 1 | D→R | γ | yes | ··· |
| 2 | D→W | β | yes | ··· |
| 3 | I→I | α | yes | ··· |
| 4 | I→R | α | yes | ··· |
| 5 | I→W | α | yes | ··· |
|   |   |   |   | ··· |
| 6 | R→I | α | yes | ··· |
| 7 | R→R | α | yes | ··· |
| 8 | R→W | α | yes | ··· |
| 9 | W→I | β | yes | ··· |
| 10 | W→R | α | yes | ··· |
| 11 | W→W | β | yes | ··· |
|   |   |   |   | ··· |

| No. | TRANSITION | EVALUATION | IMPLEMENTATION | ASSERTION |
|---|---|---|---|---|
| 0 | D→I | α | yes | assert always··· |
| 1 | D→R | γ | yes | ··· |
| 2 | D→W | β |  | ··· |
| 3 | I→I | α | yes | ··· |
| 4 | I→R | α | yes | ··· |
| 5 | I→W | α | yes | ··· |
|   |   |   |   | ··· |
| 6 | R→I | α | yes | ··· |
| 7 | R→R | α | yes | ··· |
| 8 | R→W | α | yes | ··· |
| 9 | W→I | β | yes | ··· |
| 10 | W→R | α | yes | ··· |
| 11 | W→W | β | yes | ··· |
|   |   |   |   | ··· |

FIG.33

| No. | TRANSITION | EVALUATION | IMPLEMENTATION | ASSERTION |
|---|---|---|---|---|
| 0 | D→I | α | yes | assert always··· |
| 1 | D→R | γ | yes | ··· |
| 2 | D→W | β | | |
| 3 | I→I | α | yes | ··· |
| 4 | I→R | α | yes | ··· |
| 5 | I→W | α | yes | ··· ··· |
| 6 | R→I | α | yes | ··· |
| 7 | R→R | α | yes | ··· |
| 8 | R→W | α | yes | ··· |
| 9 | W→I | β | yes | ··· |
| 10 | W→R | α | yes | ··· |
| 11 | W→W | β | yes | ··· ··· |

| VERIFICATION SCENARIO WITH PARAMETERS | | | |
|---|---|---|---|
| CLASSIFICATION | TRANSITION IN DIRW MATRIX | VERIFICATION PARAMETERS | VERIFICATION SCENARIO |
| VERIFICATION SCENARIO FOR γ | D→R | [a,b,c,p1,p2]=[xx,xx,xx,1x,0x] | 1. RESET<br>2. ASSIGN SIDE a TO REGISTER r1<br>3. ASSIGN SIDE b TO REGISTER r2<br>4. ASSIGN SIDE c TO REGISTER r3<br>5. ASSIGN PARAMETER p1 TO REGISTER r4<br>6. ASSIGN PARAMETER p2 TO REGISTER r5<br>7. SET start SIGNAL AT 1<br>8. WAIT FOR finish SIGNAL<br>9. EXECUTE 2 TO 7 AGAIN<br>9. READ RESULT d FROM REGISTER r6 |
| VERIFICATION SCENARIO FOR β | D→W | [a,b,c,p1,p2]=[xx,xx,xx,11,xx] | |
| | W→W | [a,b,c,p1,p2]=[xx,xx,xx,x1,11] | |
| | W→I | [a,b,c,p1,p2]=[xx,xx,xx,x0,1x] | |
| VERIFICATION SCENARIO FOR α | D→I | [a,b,c,p1,p2]=[xx,xx,xx,0x,xx] | |
| | I→R | [a,b,c,p1,p2]=[xx,xx,xx,0x,0x]<br>[a,b,c,p1,p2]=[xx,xx,xx,x0,x0] | |
| | I→W | [a,b,c,p1,p2]=[xx,xx,xx,0x,1x]<br>[a,b,c,p1,p2]=[xx,xx,xx,x0,x1] | |
| | R→I | [a,b,c,p1,p2]=[xx,xx,xx,x0,0x] | |
| | R→R | [a,b,c,p1,p2]=[xx,xx,xx,x1,00] | |
| | R→W | [a,b,c,p1,p2]=[xx,xx,xx,x1,01] | |
| | W→R | [a,b,c,p1,p2]=[xx,xx,xx,x1,10] | |

3400

US 8,312,400 B2

VERIFICATION SUPPORTING SYSTEM

CROSS REFERENCE TO RELATED APPLICATIONS

This is a Divisional of application Ser. No. 12/359,105, filed Jan. 23, 2009.

This application is based upon and claims the benefit of priority from the prior Japanese Patent Application No. 2008-131204, filed on May 19, 2008 and Japanese Patent Application No. 2008-200609, filed on Aug. 4, 2008, the entire contents of which are incorporated herein by reference.

FIELD

The embodiment(s) discussed herein is related to a verification supporting system.

BACKGROUND

Conventionally, in designing hardware (circuit) for realization of a desired function, it is essential to conduct logic verification to see if there is no omission in the design, as a process in a preliminary stage before actual manufacture of the hardware. Specifically, a verification scenario is produced according to the hardware design, and logic verification is carried out using an output resulting from entry of the verification scenario.

In addition, verification coverage is determined to evaluate objectively the verification process under the verification scenario produced as stated above. The verification coverage refers to information as an index of absence of sufficient patterns of simulations with a verification target. Specifically, if all patterns of simulations requiring verification constitute a parent population, a coverage ratio is determined from a proportion of the number of patterns of executed simulations, and provided as verification coverage, for example. In this case, it is deemed that verification accuracy becomes higher with an increase in verification coverage (coverage ratio).

However, there is a problem with this method by which "all patterns of simulations requiring verification" are extracted as a parent population. Such all patterns of simulations as a parent population refer to a coverage standard. If some of patterns extracted as a coverage standard are virtually useless in verification, actual efficiency of verification may not be improved even with a high coverage ratio in the simulation.

Accordingly, methods called path coverage and code coverage are currently utilized to extract patterns comprehensively in line with a specific standard. Path coverage uses patterns to verify all paths generating a state transition in registers included in a verification target circuit. Therefore, in the path coverage method, an aggregation of these patterns constitute a coverage standard. Code coverage, also called line coverage, uses patterns to verify paths in relation to input/output of registers describing source codes, which are equivalent to a verification target circuit. In the code coverage method, an aggregation of these patterns constitute a coverage standard.

Related documents are as follows: Japanese Patent Application Unexamined Publication No. 2006-190209 (patent document 1); Japanese Patent Application Unexamined Publication No. 2006-201980 (patent document 2); and Harry. D. Foster, et al, "Assertion-Based Design" (2nd Edition), "Programming Code Metrics", pp. 129 to 130 (non-patent document 1).

However, the conventional coverage standards as stated above are inefficient in many aspects and have difficulty in serving as standards of determination for improvement of verification efficiency. Specifically, in the path coverage method, extracted patterns cover all parameter values that may be input into registers included in a verification target circuit. Therefore, a nearly infinite number of patterns may be generated depending on the number and kinds of registers. As a result, there is a problem that a value of a denominator in calculation of verification coverage becomes large, which thereby requires an enormous amount of processing time.

Further, in the code coverage method, when a verification target circuit has a plurality of conditional branches, some path requiring verification may be omitted. As a result, insufficient patterns are provided and thus verification coverage is decreased in reliability, resulting in a low accuracy of verification.

SUMMARY

According to an aspect of the embodiments, a computer-readable recording medium storing a program causes a computer to perform: recording a DIRW matrix containing: possibly occurring state transitions among four states, Declare, Initialize, Read, and Write in a register included in a verification target circuit; and information on validity of paths according to the state transitions; acquiring a control data flow graph (CDFG) in which a dataflow graph (DFG) describing a data flow in a control flow graph (CFG) describing a control flow at implementation of the verification target circuit is written into the CFG; extracting, when an arbitrary register in the verification target circuit is designated as a verification target register, a DFG describing the verification target register from the CDFG; extracting a path indicative of a data flow in relation to the verification target register from the DFG; specifying a state transition of the verification target register included in the path, on the basis of the DFG; determining whether the state transition of the verification target register included in the path is set in the DIRW matrix; and deciding all the state transitions determined to be set in the DIRW matrix, as a coverage standard constituting a parent population in calculating verification coverage of the verification target register.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIG. 8 is a diagram for explaining a specification of a verification target circuit;

FIG. 9 is a diagram for explaining an example of a description of a verification scenario;

FIG. 10 is a diagram for explaining an example of a list of registers included in a specification;

FIG. 11 is a diagram for explaining an example (1) of an RTL description;

FIG. 20 is a graphical chart of an output example of a marked DIRW matrix;

FIG. 21 is graphical charts of generation examples of an implementation coverage standard;

FIG. 22 is graphical charts of generation examples of the implementation coverage standard;

FIG. 23 is a diagram for explaining a description example of a verification scenario to be continuously executed;

FIG. 24 is a diagram for explaining a description example (2) of an RTL description;

FIG. 31 is a graphical chart of an output example of a marked DIRW matrix under a continuous verification scenario;

FIG. 32 is graphical charts of a generation example of an implementation coverage standard under a continuous verification scenario;

FIG. 33 is graphical charts of a generation example of an implementation coverage standard under a continuous verification scenario; and FIG. 34 is a graphical chart of an output example of a verification scenario with parameters.

DESCRIPTION OF EMBODIMENT(S)

Preferred embodiments of the present invention will be explained with reference to the accompanying drawings.

The verification supporting program, verification supporting system, and verification supporting method realize verification supporting by deciding a coverage standard for realization of efficient verification with the use of a DIRW matrix that contains state transitions possibly occurring in a verification target register and information on validity of paths according to the state transitions, and providing verification coverage with a high accuracy of verification. The DIRW matrix contains possibly occurring state transitions among four states, Declare, Initialize, Read, and Write in a register included in a verification target circuit, and information on validity of paths according to the state transitions.

Figure 1:
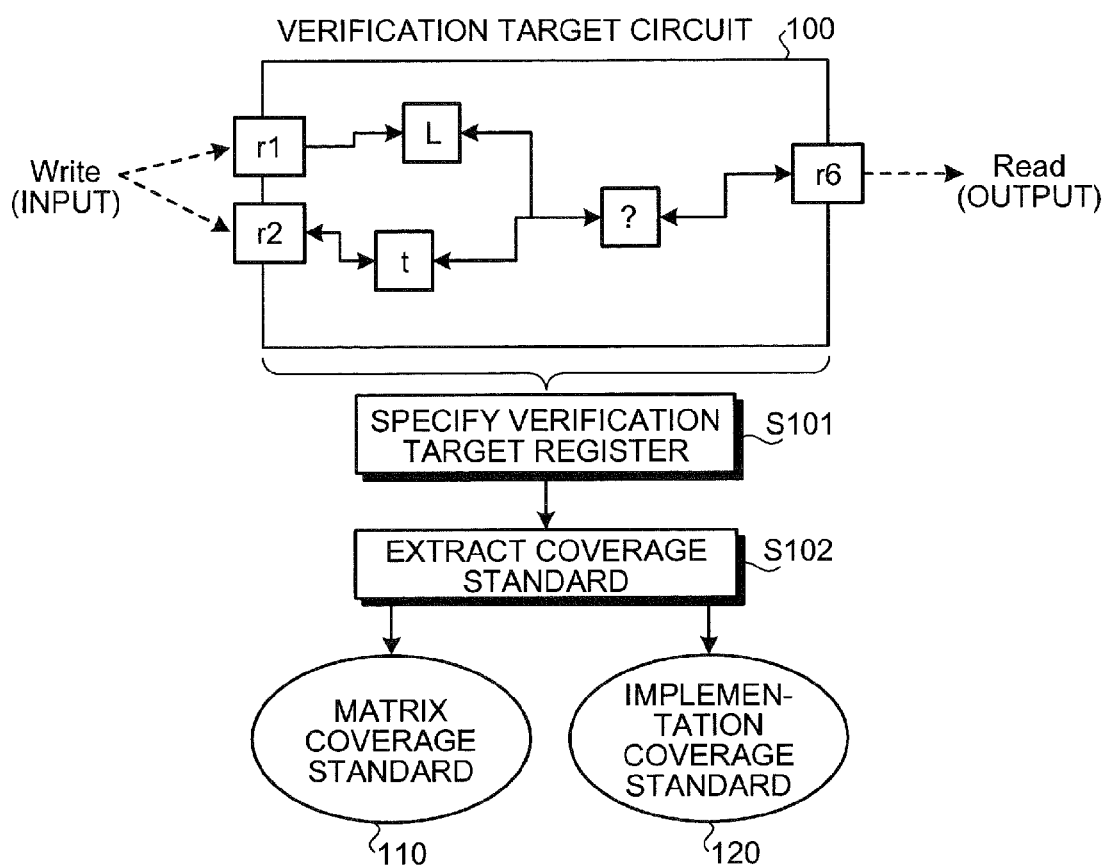
FIG. 1 is a diagram for explaining an outline of a verification supporting process.

An outline of a verification supporting process in this embodiment will be explained. FIG. 1 is a diagram for explaining the outline of the verification supporting process in this embodiment. In carrying out hardware verification as depicted in FIG. 1, a register as a verification target (hereinafter "verification target register") is specified from a configuration of a circuit as a verification target (a verification target circuit 100) (step S101).

Types of registers included in the verification target circuit 100 will be explained. The registers are divided roughly into three types listed below. Any registers within the three types can be specified as a verification target register.

1. I/O register accessible from outside of the verification target circuit
  e.g.) r1 and r2 in the verification target circuit 100
2. Internal register described in the specification
  e.g.) L and t in the verification target circuit 100
3. Implementation-dependent register, existence of which depends on the implementation and is not described in the specification
  e.g.) "?" in the verification target circuit 100

When the verification target register is specified at step S101, a parent population of patterns requiring verification is decided as a coverage standard for the specified verification target register (step S102). The coverage standard constitutes a standard for evaluating completeness of determination on verification coverage (a coverage ratio of verification). Therefore, in this embodiment, the coverage standard contains all patterns of simulations requiring verification in the verification target circuit 100. Further in this embodiment, two coverage standards, a matrix coverage standard 110 and an implementation coverage standard 120, are decided through a process at step S102.

Figures 2A, 2B, 3:
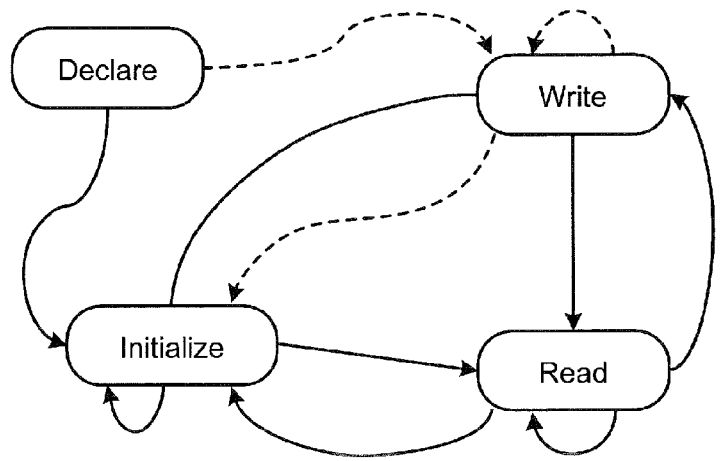
FIG. 2A is a diagram of state transitions of a DIRW matrix.
FIG. 2B is a table of truth values indicating the DIRW matrix.
FIG. 3 is a diagram for explaining a matrix coverage standard.

In this embodiment, as stated above, the DIRW matrix is prepared and used to generate the coverage standards (110 and 120) depicted in FIG. 1. The DIRW matrix is a data group which contains possibly occurring state transitions among four states of "Declare", "Initialize", "Read" and "Write" in registers included in the verification target circuit 100 and information on validity of paths according to the state transitions. First, the DRIW matrix will be explained. FIG. 2A is a diagram of state transitions of the DIRW matrix (verification of an internal register). FIG. 2B is a table of truth values indicating the DIRW matrix (verification of an internal register).

The DIRW matrix used in this embodiment is information indicative of path states according to state transitions in a register included in the verification target circuit 100. The state transition diagram depicted in FIG. 2A represents examples of state transitions among the following four states, which possibly occur in a verification target register.

Declare (definition)
Initialize (initialization)
Read (reading)
Write (writing)

In the state transition diagram depicted in FIG. 2A, transitions indicated by an arrow of a solid line (e.g. Write-Read) refer to correct paths. In addition, transitions indicated by a dashed line (e.g. Write-Initialize) refer to paths that need to be checked for design intent. Further, transitions with no arrow (e.g. Declare-Read) refer to paths generating bugs. Incidentally, in the DIRW matrix explained here, no transition to Declare take place and thus there is no arrow indicative of a transition to Declare.

FIG. 2B is a table of truth values in which the state transitions depicted in FIG. 2A are tabulated. In FIG. 2B, with respect to paths before transition and paths after transition, validity information is presented in three categories. Specifically, the three categories are: correct path "α"; path to be checked for design intent "β"; and path generating a bug "γ".

The two coverage standards generated using the DIRW matrix, the matrix coverage standard 110 and the implementation coverage standard 120 will be explained.

The matrix coverage standard will be explained. FIG. 3 is a diagram for explaining the matrix coverage standard. The matrix coverage standard covers shaded sections in the truth value table depicted in FIG. 3. That is, patterns of simulations realizing all the state transitions set in the DIRW matrix constitute a parent population in the matrix coverage standard.

Therefore, the truth value table in FIG. 3 contains 12 state transitions and thus a denominator in calculation of verification coverage becomes 12. In addition, out of the 12 simulation patterns, the number of executed patterns is used as a numerator to determine a coverage ratio, and the coverage ratio is provided as verification coverage.

Figures 4, 5:
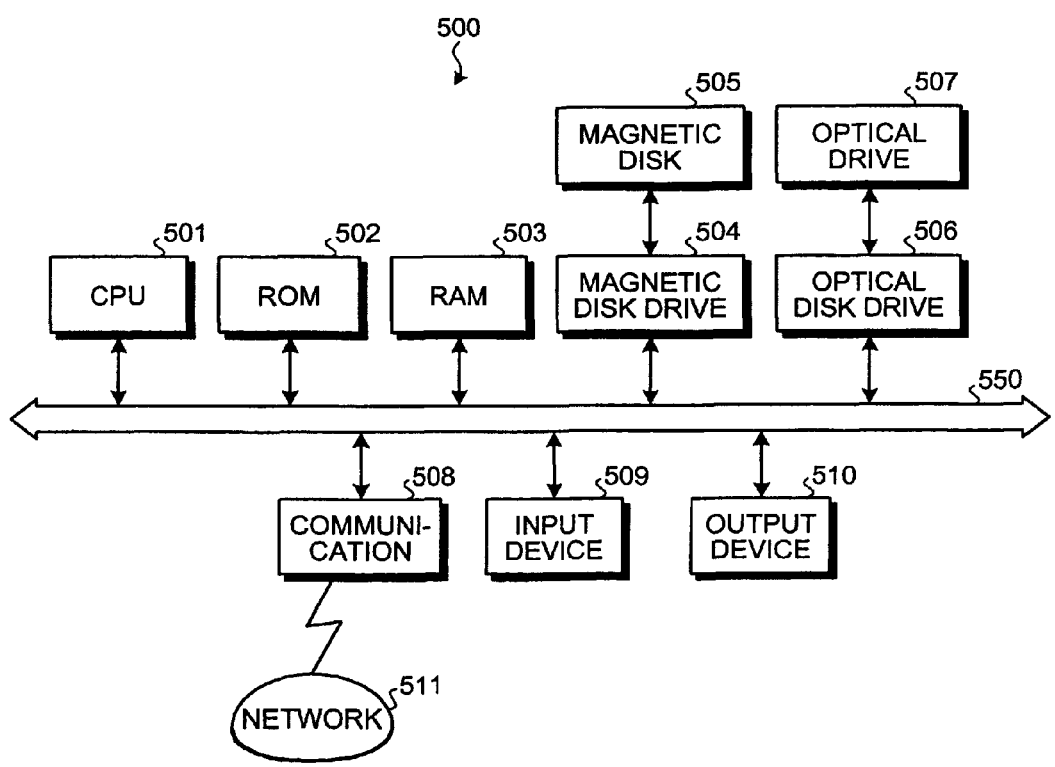
FIG. 4 is a diagram for explaining an implementation coverage standard.
FIG. 5 is a block diagram of a verification supporting apparatus.

Next, the implementation coverage standard will be explained. FIG. 4 is a diagram for explaining the implementation coverage standard. The truth value table in FIG. 4 describes implementation examples of a register in the verification target circuit 100. The implementation coverage standard covers shaded sections indicative of presence of implementation in the truth value table depicted in FIG. 4. That is, out of the state transitions set in the DIRW matrix, patterns of simulations for realizing state transitions in an implemented register constitute a parent population in the implementation coverage standard.

Therefore, the truth value table in FIG. 4 contains four state transitions, and thus a denominator in calculation of verification coverage becomes four. In addition, out of the four simulation patterns, the number of executed patterns is used as a numerator to determine a coverage ratio, and the coverage ratio is provided as verification coverage.

In this embodiment, as stated above, the DIRW matrix is used to decide the two coverage standards, the matrix coverage standard 110 and the implementation coverage standard 120. These decided coverage standards contain the state transitions extracted focusing on a specific register, which avoids a situation in which an enormous number of patterns requiring verification are generated as with a conventional path coverage method. In addition, these coverage standards prevent a situation in which any required path is omitted as with a conventional code coverage method.

In determining the coverage standards for another register included in the verification target circuit 100, the register can be specified as a verification target register and subjected to the same process. In this manner, since coverage standards are decided only for registers requiring verification, it is possible to exclude unnecessary patterns of simulations.

Specific configurations of the verification supporting system and details of a process for deciding the coverage standards using the DIRW matrix by the verification supporting system as stated above will be explained below.

FIG. 5 is a block diagram of a verification supporting apparatus according to the embodiments. As depicted in FIG. 5, the verification supporting apparatus 500 includes a central processing unit (CPU) 501, a read-only memory (ROM) 502, a random access memory (RAM) 503, a magnetic disk drive 504, a magnetic disk 505, a optical disc drive 506, an optical disc 507, a communication interface (I/F) 508, an input device 509, and an output device 510, connected to one another by way of a bus 550.

The CPU 501 governs overall control of the verification supporting apparatus 500. The ROM 502 stores therein various programs such as a boot program and a verification supporting program. The RAM 503 is used as a work area of the CPU 501. The magnetic disk drive 504, under the control of the CPU 501, controls reading/writing of data from/to the magnetic disk 505. The magnetic disk 505 stores therein the data written under control of the magnetic disk drive 504. The ROM 502 may store a verification program that executes a verification simulation according to a verification scenario created by the verification supporting program. In this case, the verification supporting apparatus 500 can provide not only the verification scenario but also an actual verification result.

The optical disc drive 506, under the control of the CPU 501, controls reading/writing of data from/to the optical disc 507. The optical disc 507 stores therein the data written under control of the optical disc drive 506, the data being read by a computer.

The communication I/F 508 is connected to a network 511 such as a local area network (LAN), a wide area network (WAN), and the Internet through a communication line and is connected to other apparatuses through this network 511. The communication I/F 508 administers an internal interface and the network 511, and controls the input/output of data from/to external apparatuses. For example, a modem or a LAN adaptor may be employed as the communication I/F 508.

The input device 509 receives input from an external source to the verification supporting apparatus 500. The input device 509 may be a keyboard, a mouse, etc.

In the case of the keyboard, the keyboard includes, for example, keys for inputting letters, numerals, and various instructions and performs the input of data. The input device 509 may be a touch-panel-type input pad or numeric keypad, etc. In the case of a mouse, the input device 509, for example, performs the movement of the cursor, selection of a region, or movement and size change of windows. The input device 509 may be a track ball or a joy stick provided each respectively has a function similar to a pointing device.

The output device 510 outputs the verification scenario created by the verification supporting apparatus 500, the verification result according to the verification scenario, and so on. Specific examples of the output device 510 include a display, a printer, etc.

In the case of a display, the output device 510 displays, for example, data such as texts, images, functional information, etc., in addition to a cursor, icons, or tool boxes. A cathode ray tube (CRT), a thin-film-transistor (TFT) liquid crystal display, a plasma display, etc., may be employed as the display. In the case of a printer, the output device 510, for example, prints image data and text data. A laser printer or an ink jet printer may be employed as the printer.

Figure 6A:
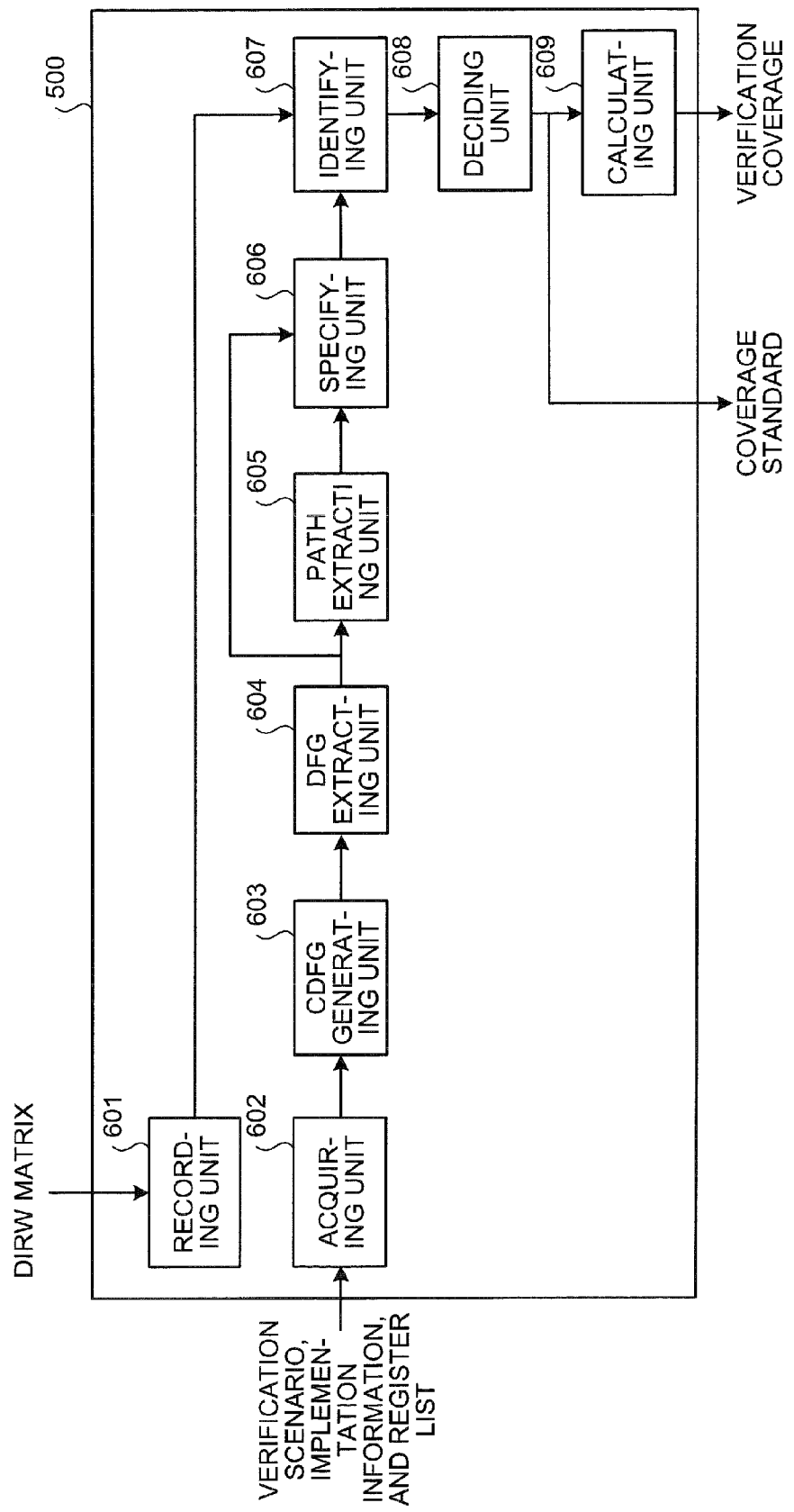
FIG. 6A is a block diagram of a functional configuration of a verification supporting system.

Next, a functional configuration of the verification supporting system 500 will be explained. FIG. 6A is a block diagram of the functional configuration of the verification supporting system. The verification supporting system 500 includes a recording unit 601, an acquiring unit 602, a CDFG generating unit 603, a DFG extracting unit 604, a path extracting unit 605, a specifying unit 606, a determining unit 607, a deciding unit 608, and a calculating unit 609. Specifically, these functions constituting a control section (the acquiring unit 602 to the calculating unit 609) are realized by causing a CPU 501 to execute a verification supporting program stored in a storage area such as the ROM 502, the RAM 503, the magnetic disk 505, or the optical disk 507 depicted in FIG. 5, or through the communication I/F 508, for example.

The recoding unit 601 is a functional part that records the DIRW matrix which contains possibly occurring state transitions among the four states, "Declare", "Initialize", "Read", and "Write" in registers included in a verification target circuit and information on validity of paths according to the state transitions. The design intent of the verification target circuit 100 is incorporated into the validity information of paths in the DIRW matrix. The recording unit 601 is realized by the magnetic disk 505 or the optical disc 507, for example.

The acquiring unit 602 is a functional part that acquires input data required for the verification supporting system 500 to extract an effective coverage standard. Specifically, the acquiring unit 602 acquires a verification scenario describing details of verification with respect to the verification target circuit 100, implementation information of the verification target circuit 100, and a register list providing attributes of registers described in the specification of the verification target circuit 100. The acquired data is stored in a storage area such as the RAM 503, the magnetic disk 505, or the optical disc 507.

Out of the data acquired by the acquiring unit 602, the register list is optionally acquired. If the register list is not acquired, a list generating unit (not depicted) may be prepared to generate a register list through extraction of registers included in the verification target circuit 100 from the implementation information of the verification target circuit 100 acquired by the acquiring unit 602. The generated register list is also stored in a storage area such as the RAM 503, the magnetic disk 505, or the optical disc 507.

The CDFG generating unit 603 is a functional part that generates, from the implementation information and the register list acquired by the acquiring unit 602, a control data flow graph (CDFG) in which a data flow graph (DFG) describing a data flow in a control flow graph (CFG) describing a control flow at the implementation of the verification target circuit 100 is written into the CFG. The generated CDFG is stored in a storage area such as the RAM 503, the magnetic disk 505, or the optical disc 507.

The DFG extracting unit 604 is a functional part that extracts a DFG describing a register designated as a verification target register out of the registers included in the verification target circuit 100, from the CDFG generated by the CDFG generating unit 603. Information of the extracted DFG is stored in a storage area such as the RAM 503, the magnetic disk 505, or the optical disc 507.

The path extracting unit 605 is a functional part that extracts a path indicative of a data flow relating to an internal register, from the DFG extracted by the DFG extracting unit 604. Information of the extracted path is stored in a storage area such as the RAM 503, the magnetic disk 505, or the optical disc 507.

The specifying unit 606 is a functional part that specifies a state transition of a verification target register included in the path extracted by the path-extracting unit 605. The state transition of the verification target register included in the path refers to a transition from an anterior state to a posterior state among the four states "Declare", "Initialize", "Read", and "Write". Specifically, the state transition may be a transition from "Declare" to "Read", a transition from "Initialize" to "Write", or others. The specifying unit 606 specifies the state transition from the description of the DFG. A specification result is stored in a storage area such as the RAM 503, the magnetic disk 505, or the optical disc 507.

The determining unit 607 is a functional part that determines whether the state transition specified by the specifying unit 606 is set in the DIRW matrix. A determination result is stored in a storage area such as the RAM 503, the magnetic disk 505, or the optical disc 507.

The deciding unit 608 can decide two coverage standards in different approaches. First, in extracting an implementation coverage standard, the deciding unit 608 extracts all the state transitions determined to be set in the DIRW matrix by the determining unit 607, as a parent population in calculating verification coverage of a verification target register. Meanwhile, in extracting a matrix coverage standard, the deciding unit 608 extracts all the state transitions contained in the DIRW matrix, as a parent population in calculating verification coverage of a verification target register.

In either case of using the implementation coverage standard or the matrix coverage standard, a parent population formed of the state transitions decided by the deciding unit 608 as stated above, constitutes the coverage standard of a verification target register. The coverage standard decided by the deciding unit 608 may be stored in a storage area such as the RAM 503, the magnetic disk 505, or the optical disc 507, or may be output to outside using the communication I/F 508 to thereby cause an external device to perform a verification simulation.

If a simulation is carried out using the validity information of a path according to the state transition determined to be set in the DIRW matrix by the determining unit 607, the calculating unit 609 performs a calculation, using the coverage standard decided by the deciding unit 608 as a denominator and the number of executed simulations as a numerator. The calculating unit 609 outputs a calculation result as verification coverage. That is, the calculation result indicates the coverage ratio of the coverage standard decided by the deciding unit 608. The verification coverage output by the calculating unit 609 may be provided on a display or a printer as the output device 510, or may be stored in a storage area such as the RAM 503, the magnetic disk 505, or the optical disc 507. In addition, the verification coverage may be transmitted to an external device through the communication I/F 508.

Figure 6B:
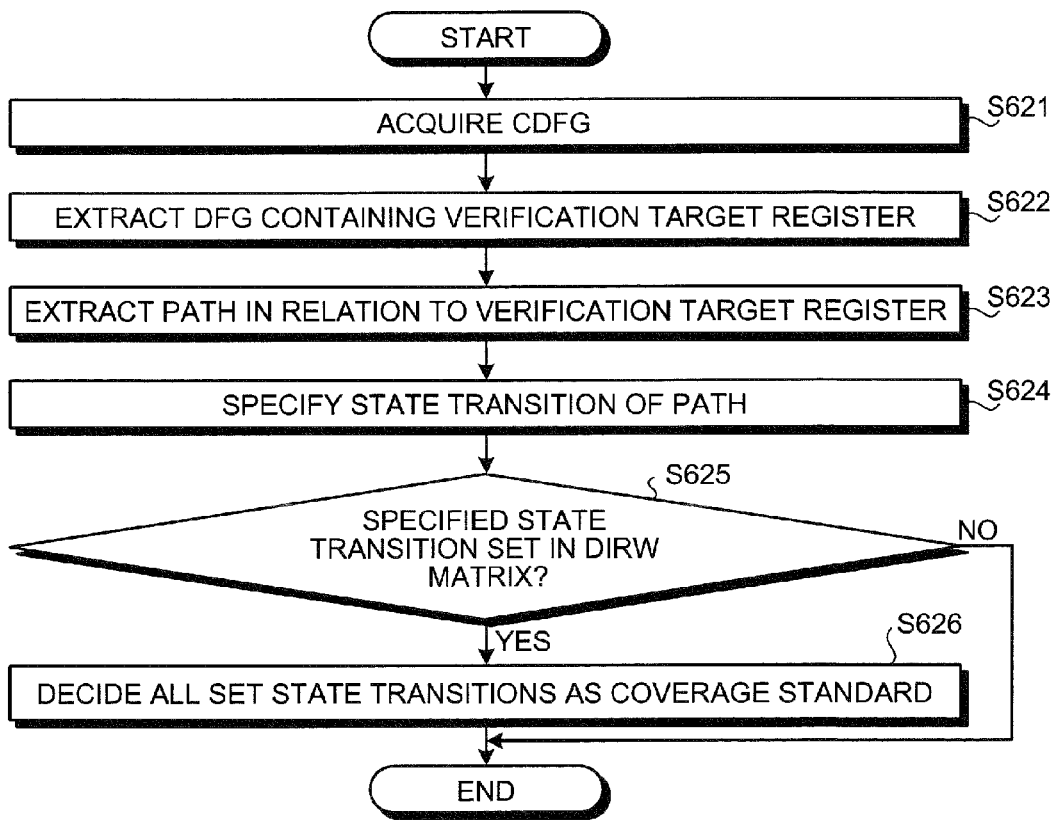
FIG. 6B is a flowchart of steps of deciding a coverage standard.

FIG. 6B is a flowchart of steps of deciding a coverage standard. The verification support system 500 including the functional parts depicted in FIG. 6A is most characterized in steps of acquiring a CDFG and deciding an implementation coverage standard from the DIRW matrix. Therefore, the steps of deciding a coverage standard will be explained below with reference to FIG. 6B.

In the flowchart of FIG. 6B, first, a CDFG of the verification target circuit 100 is acquired (step S621). A DFG covering the verification target register is extracted from the acquired CDFG (step S622). Paths in relation to the verification target register are extracted with reference to the DFG extracted at step S622 (step S623).

State transitions of the paths extracted at step S623 are specified (step S624), and it is determined whether the specified state transitions are set in the DIRW matrix (step S625). If the state transitions are not set in the DIRW matrix (step S625: NO), a series of steps is terminated as it is. In contrast, if the state transitions are set in the DIRW matrix (step S625: YES), all the set state transitions are decided as a coverage standard (step S626), and a series of steps is terminated.

In deciding a coverage standard for a register included in the verification support system 500 as a verification target register as stated above, it is possible to decide either the implementation coverage standard or the matrix coverage standard or the both even if any register is set as a verification target register. In addition, it is possible to calculate efficient verification coverage using the coverage standard.

As explained in relation to the functional configuration depicted in FIG. 6A, a configuration of required functional parts varies greatly depending on whether the verification support system 500 decides the matrix coverage standard or the implementation coverage standard. In deciding the matrix coverage standard, it is only required to, out of the functional parts depicted in FIG. 6A, prepare the recoding unit 601 recording the DIRW matrix and the deciding unit 608.

Therefore, either of the two coverage standards may be decided according to verification accuracy required by a user of the verification support system 500 or a high-order system of the same, or according to usage environment of the verification support system 500. The matrix coverage standard can be decided at a higher speed because the matrix coverage standard is uniquely determined by acquiring the DIRW matrix. In addition, simulation patterns determined as the matrix coverage standard correspond to all the state transitions set in the DIRW matrix. Therefore, as compared with the implementation standard described later, increasing a coverage ratio with the matrix coverage standard requires simulating a larger number of patterns.

Meanwhile, deciding the implementation standard involves many process steps and thus takes much time, as compared with deciding the matrix coverage standard. Simulation patterns determined as the implementation coverage standard focuses on state transitions possibly occurring in a register implemented in the verification target circuit 100. Therefore, as compared with the matrix coverage standard, the number of patterns as the implementation coverage standard is smaller and a coverage ratio with the implementation coverage standard is higher even though the number of simulated patterns is small. Incidentally, using the matrix coverage standard can also significantly decrease the number of simulation patterns as compared with using a conventional coverage standard.

Next, decision of the foregoing coverage standards and calculation of verification coverage using the decided coverage standards will be explained with reference to specific input/output examples.

Figure 7:
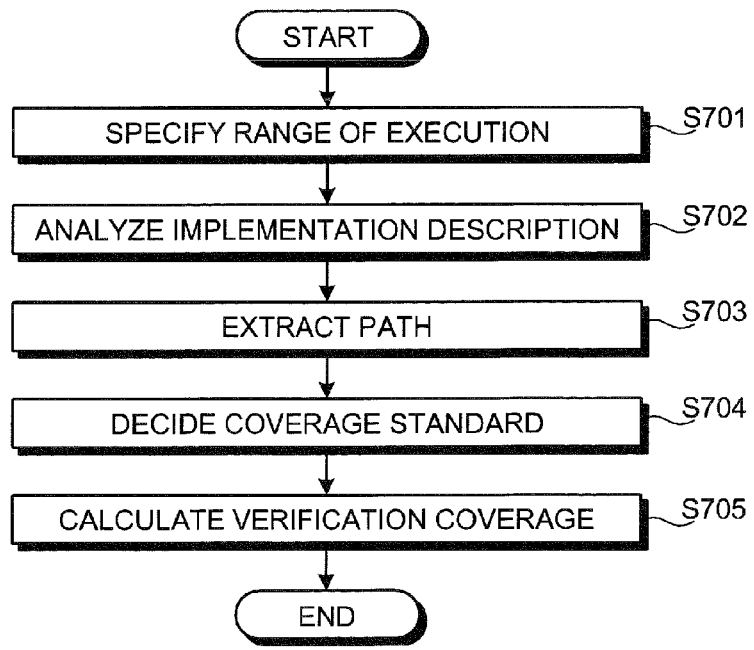
FIG. 7 is a flowchart of steps of calculating verification coverage.

First, an overall process of calculating verification coverage will be explained. FIG. 7 is a flowchart of steps of calculating verification coverage. Here, before explanation of the actual steps, input data for use in calculation of verification coverage will be explained. In this embodiment, information items listed below, i) to iv), are input to determine a coverage standard.

i) Verification scenario
ii) List of registers as verification targets
iii) Information of hardware implementation
iv) DIRW matrix These information items i) to iii) will be individually explained. The iv) DIRW matrix constitutes the information explained in relation to FIGS. 2A and 2B. A process in this embodiment is characterized by use of the iv) DIRW matrix.

In the flowchart of FIG. 7, first, the information items i) to iii) are input to specify a range of execution in the verification scenario (step S701), and an implementation description is analyzed (step S702). After that, the iv) DIRW matrix is input to extract paths (step S703). Next, a coverage standard is decided from the extracted paths (step S704). The decided coverage standard is used to calculate verification coverage (step S705), and a series of process steps is terminated. Details of the steps and input information will be explained below.

At step S701, a description of a register transfer level (RTL) in an entire system, a verification scenario in the entire system, and a list of registers in the entire system are input (corresponding to the foregoing i) to iii)). FIG. 8 is a diagram for explaining a specification of the verification target circuit. The verification scenario of the verification target circuit 100 to be input at step S701 is set according to the description of the specification 800.

FIG. 9 is a diagram for explaining an example of a description of a verification scenario. The verification scenario 900 in FIG. 9 includes a verification process reflected by contents of the specification 800 depicted in FIG. 8. FIG. 10 is a diagram for explaining an example of a list of registers included in the specification. The registers appearing in the verification scenario 900 are configured as described in a register list 1000. FIG. 11 is a diagram for explaining an example (1) of an RTL description. This RTL description 1100 constitutes information of hardware implementation. In addition, a description 1101 of the RTL description 1100 corresponds to the registers provided in the register list 1000 (refer to FIG. 10).

As stated above, the register list 1000 can be generated from the RTL description 1100. Therefore, if the register list 1000 is not input, the register list 1000 is produced from the RTL description 1100. However, the generated register list contains no information on constraint conditions in the register list 1000 depicted in FIG. 10. If no constraint conditions are contained, no constraints are imposed on setting registers, which thereby extends a verification range. Therefore, preparing the register list 1000 can limit a verification range by constraint conditions.

When the foregoing information items are input, a range of verification to be performed by the verification scenario 900 is extracted from the entire RTL description 1100 at step S701. Therefore, after step S701, the RTL description on the specified range, the verification scenario, and the register list are output.

In specifying a range of execution at step S701, a user may extract the range by his/her own, on the basis of the input information or with the use of a publicly known technique. For example, a range of execution can be easily specified using a technique described in patent document 1. In addition, at step S701, a range of verification required by a user for verification support is specified from the entire system. Therefore, executing step S701 can increase processing efficiency of the entire verification support process. Alternatively, step S701 may be omitted to thereby verify the entire system as a verification target.

At step S702, the RTL description in which a range of execution is specified at step S701 (refer to FIG. 11) and the register list (refer to FIG. 10) are input. Subsequently, a CFG indicative of a control flow and a DFG indicative of a data flow are generated from the input RTL description.

Figure 12:
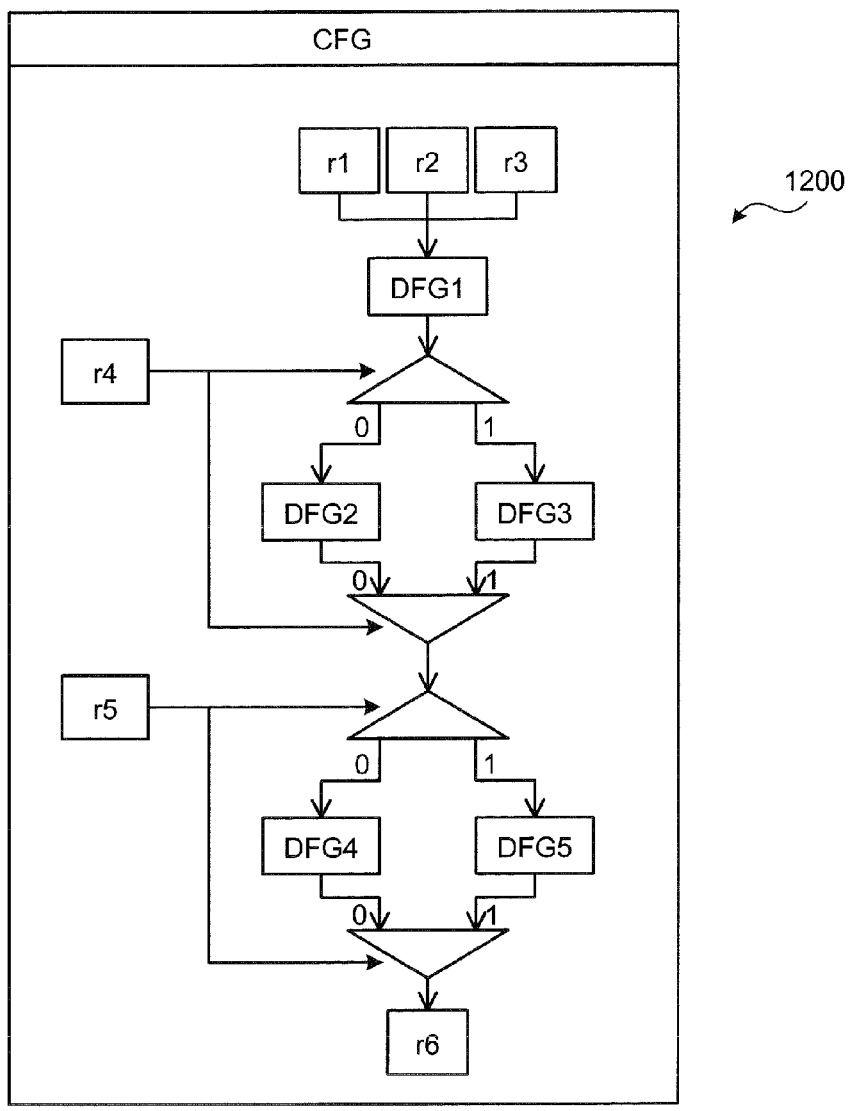
FIG. 12 is a circuit diagram for explaining an example of a CFG configuration.
Figure 13A:
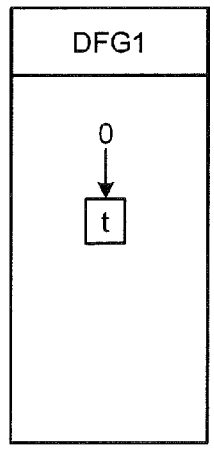
FIGS. 13A to 13E are circuit diagrams of configurations of DFGs 1 to 5.
Figure 13B:
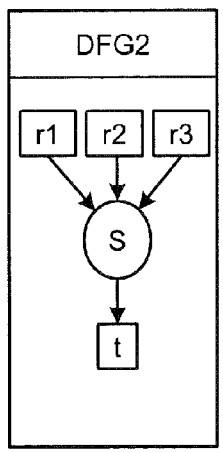
Figure 13C:
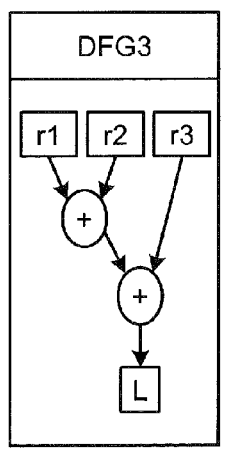
Figure 13D:
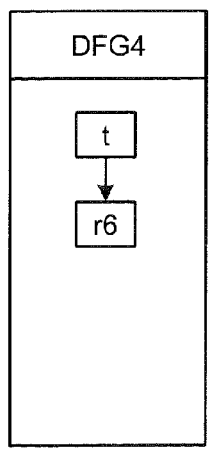
Figure 13E:
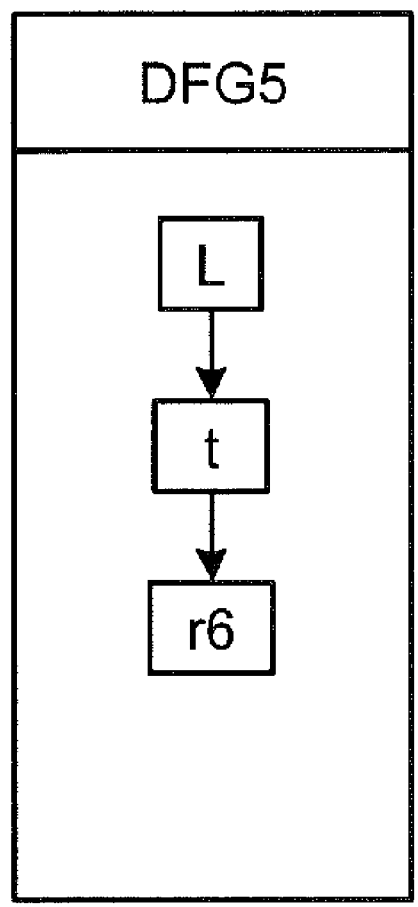

FIG. 12 is a circuit diagram for explaining an example of a CFG configuration. A CFG 1200 in FIG. 12 depicts visually a flow of control according to the RTL description. In the RTL description 1100 of FIG. 11, data control is carried out according to descriptions 1102 to 1108. Therefore, the process flow of the CFG 1200 corresponds to the descriptions 1102 to 1108.

In addition, the CFG 1200 includes five DFGs. FIGS. 13A to 13E are circuit diagrams of configurations of DFGs 1 to 5. Registers depicted in FIGS. 13A to 13E are assigned parameters listed below and perform individual operations. The DFG 1200 corresponds to the description 1102 depicted in FIG. 11, the DFG 1 to the description 1103 in FIG. 11, the DFG 2 to the description 1104, the DFG 3 to the description

Figure 14:
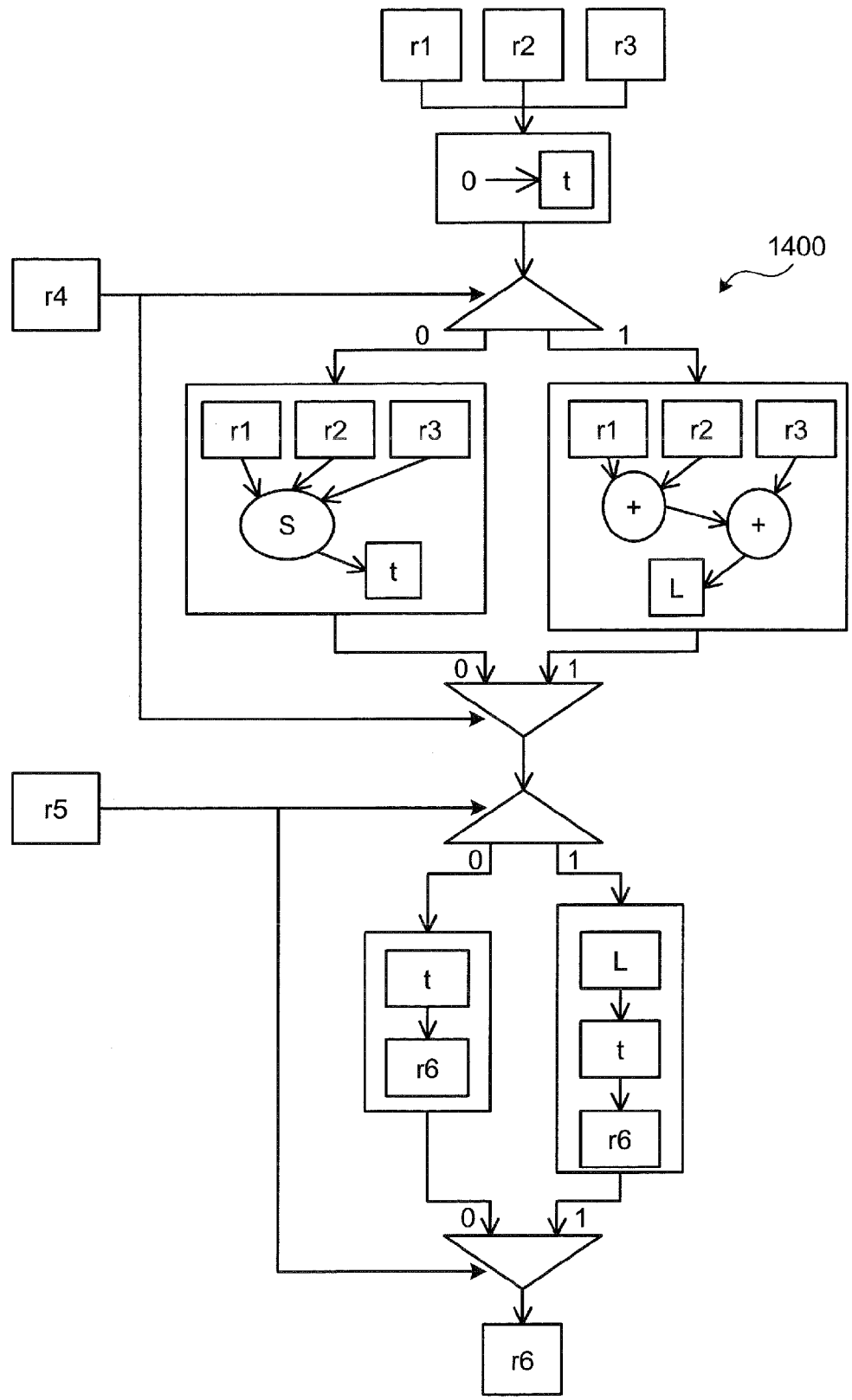
FIG. 14 is a circuit diagram for explaining a CDFG configuration example.

1105, the DFG 4 to the description 1106, and the DFG 5 to the descriptions 1107 and 1108, respectively.

r1=a, r2=b, r3=c, r4=p1, r5=p2, r6=d
t, L: Internal register
+: addition
S: Operation for determination of an area When the CFG and DFGs are generated as stated above, these resultants are used to further generate a CDFG. FIG. 14 is a circuit diagram for explaining a CDFG configuration example. As depicted in FIG. 14, a CDFG 1400 is a synthesis of the CFG (refer to FIG. 12) and DFGs (refer to FIGS. 13A to 13E). The CDFG may be generated using a high-level synthesis technology in which a circuit is generated from an RTL description, for example (Yusuke Matsunaga, "Basics of a High-level Synthesis Technology", Institute of Electronics, Information and Communication Engineers, Society Conference in Japan, September 2003).

Figure 15:
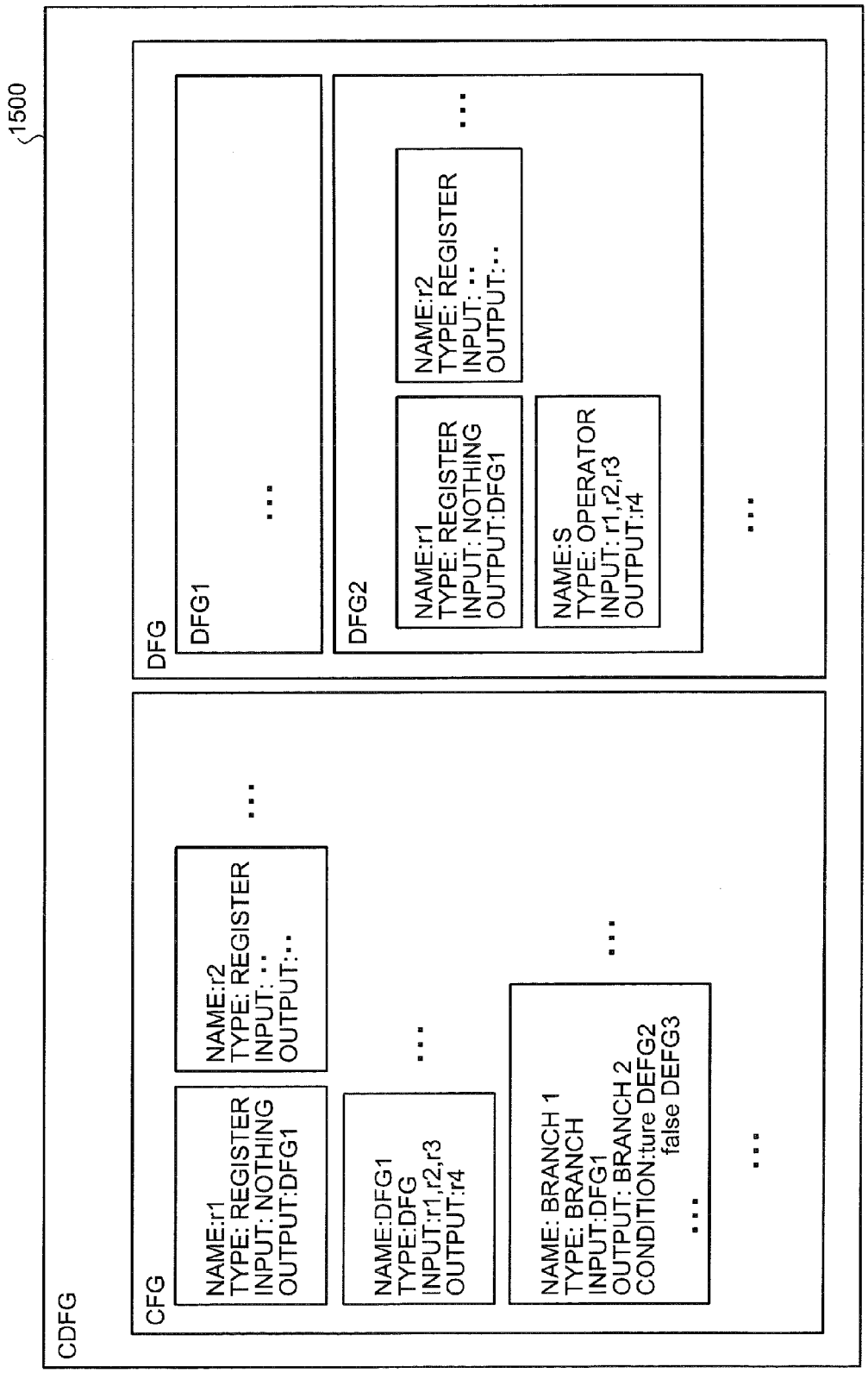
FIG. 15 is a diagram for explaining a data structure of the CDFG.

FIG. 15 is a diagram for explaining a data structure of the CDFG. At step S702, CDFG data 1500 is finally output corresponding to the input RTL description. The CDFG data 1500 has the data structure depicted in FIG. 15 in which each of the CFG contains DFGs.

Figure 16:
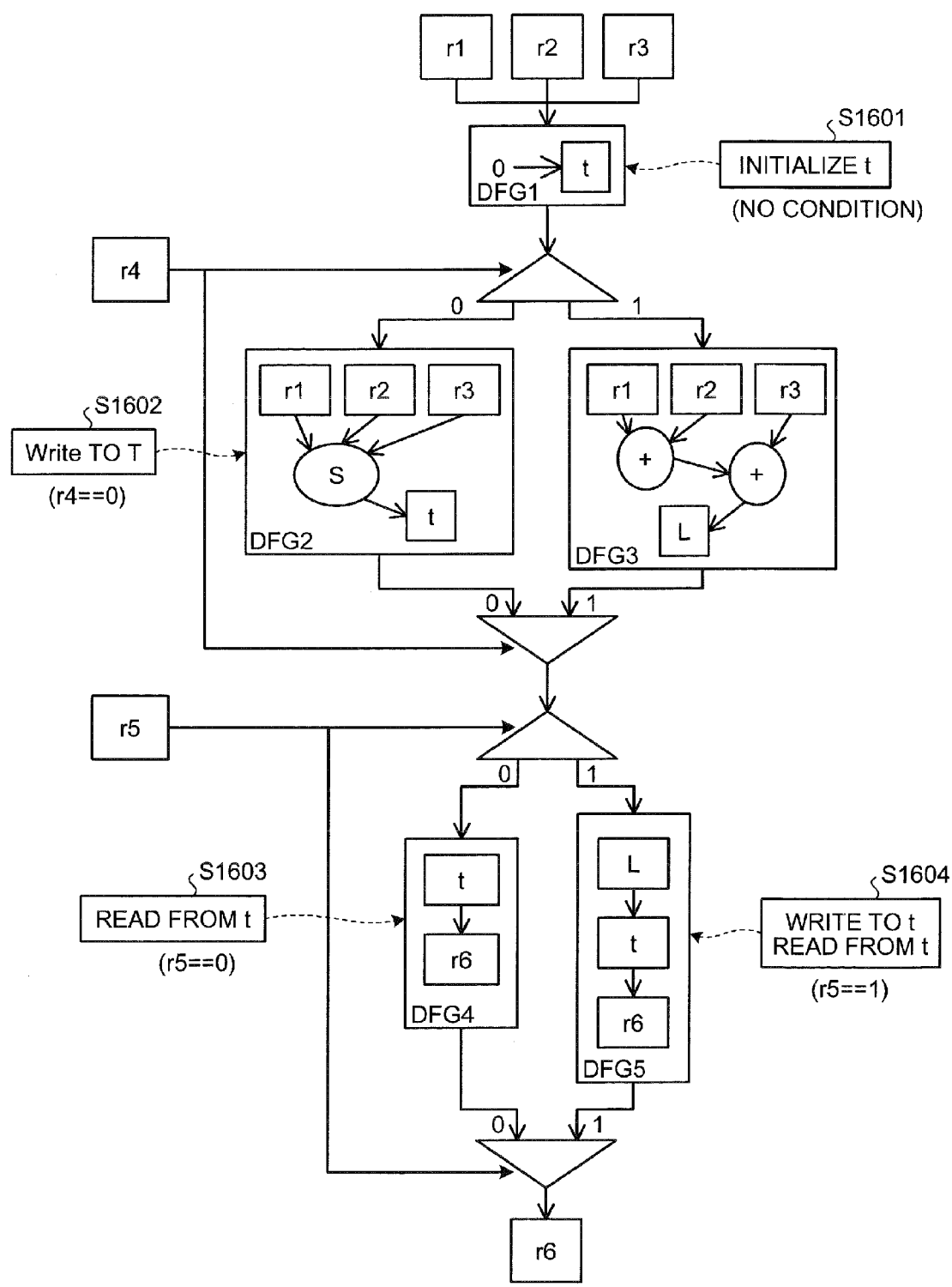
FIG. 16 is a diagram for explaining steps of extracting paths in relation to an internal register t.

At step S703, the CDFG generated by analysis of the implementation description at step S702 and the DIRW matrix are input to thereby output paths corresponding to the DIRW. At step S703, paths are extracted in relation to a specific internal register with reference to the DIRW matrix as explained with reference to FIGS. 2A and 2B. FIG. 16 is a diagram for explaining steps of extracting paths in relation to an internal register t. The steps of extracting paths in relation to the internal register t will be explained below with reference to FIG. 16.

The CDFG generated at step S702 has four sections at which the internal register t is used: DFG1; DFG2; DFG4; and DFG5. Therefore, paths in relation to the internal register t in the four DFGs are extracted to see what transitions take place. Specifically, the following path extractions in relation to the internal registers t are carried out.

Path to initialize t of 0 in the DFG1 (step S1601)
Path to write S to t in the DFG2 (step S1602)
Path to read from t to r6 in the DFG4 (step S1603)
Path to write from L to t in the DFG5 and path to read from t to r6 in the DFG5 (step S1604)

The internal register t has conditions in the DFG1, DFG2, DFG4, and DFG5, according to the RTL description 1100. For example, the DFG1 has no condition according to the description 1102, and the DFG2 has a condition under which a value of r4 is set at 0 according to the description 1103. At step S703, the paths extracted as stated above, are further extracted according to path classification under the DIRW matrix($\alpha$, $\beta$, $\gamma$).

Figure 17:
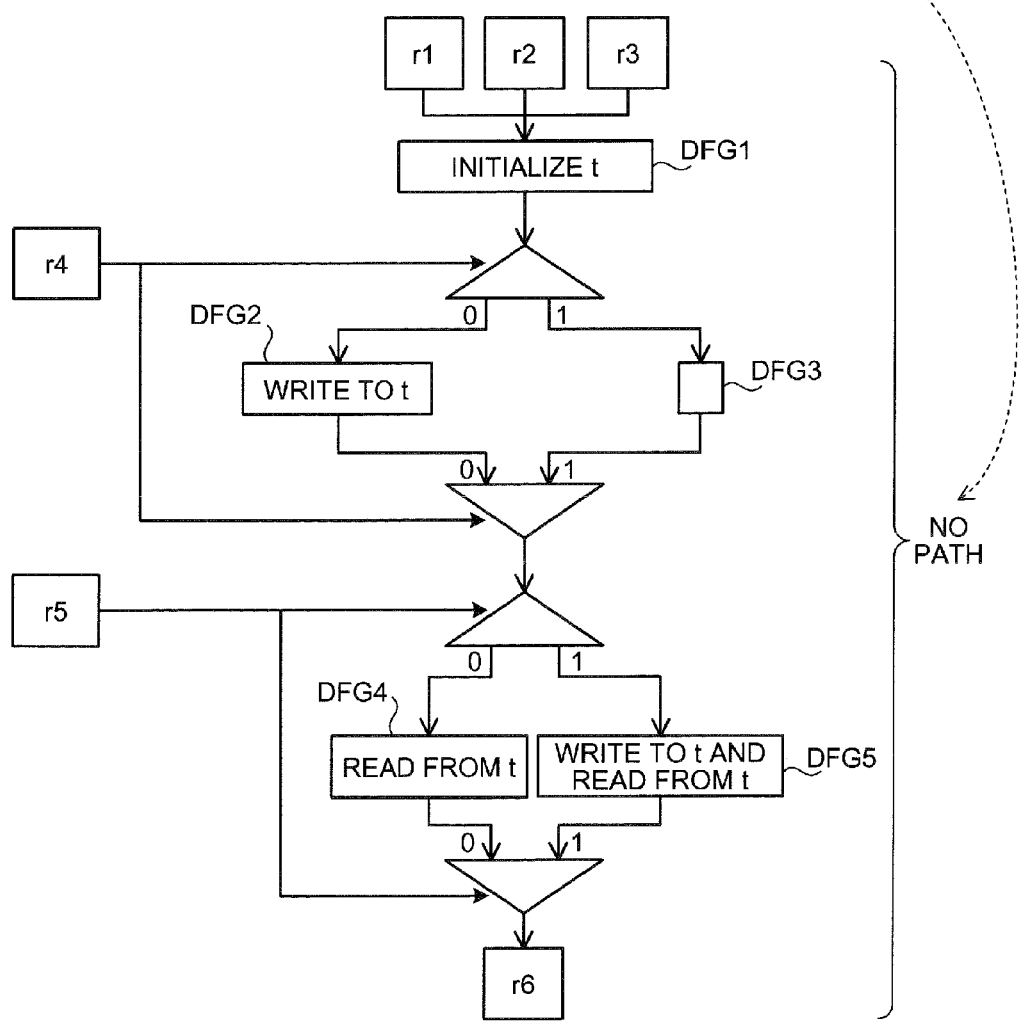
FIG. 17 is a diagram for explaining extraction of a path generating a bug.

First, extraction of a path generating a bug ($\gamma$) will be explained. FIG. 17 is a diagram for explaining extraction of a path generating a bug. As depicted in a true value table 1700 of FIG. 17, there exists a path generating a bug, Declare→Read ($\gamma$1). However, the verification target circuit 100 has no path resulting in a state transition of Declare→Read for the internal register t. Therefore, no path generating a bug ($\gamma$) is extracted.

Figure 18:
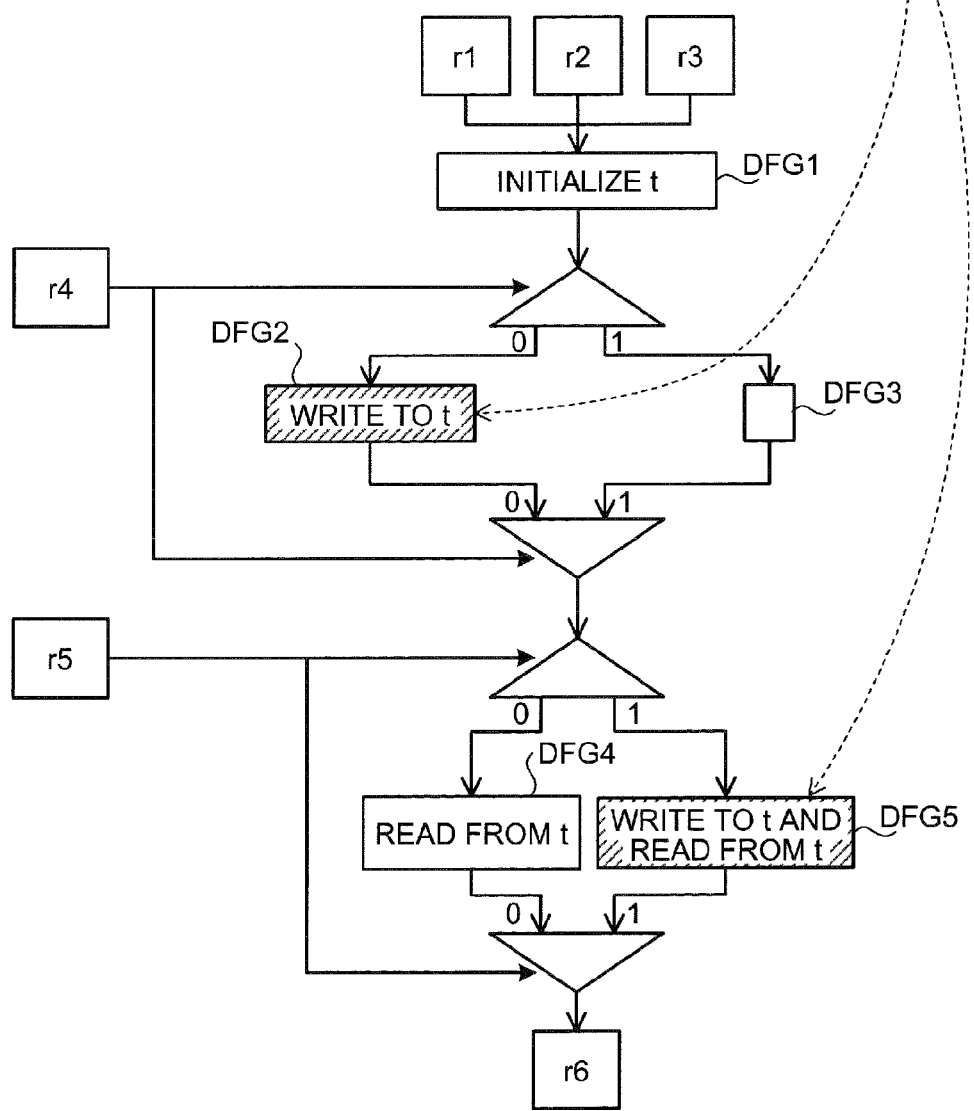
FIG. 18 is a diagram for explaining extraction of a path requiring a check.

Next, extraction of a path requiring a check for design intent ($\beta$) will be explained. FIG. 18 is a diagram for explaining extraction of a path requiring a check. As depicted in a true value table 1800 of FIG. 18, there exist paths requiring a check, Declare→Write ($\beta$1), Write→Initialize ($\beta$2), and Write→Write ($\beta$3). Out of the three paths, the DFG 2 and DFG 5 have the path Write→Write ($\beta$3) which is extracted as a path requiring a check ($\beta$). In this embodiment, the extracted path involves implementation of the internal register t. Therefore, out of the state transitions set in the DIRW matrix, the state transition indicative of the extracted path needs to have a dedicated flag set so as to be differentiated from the other state transitions.

Figure 19:
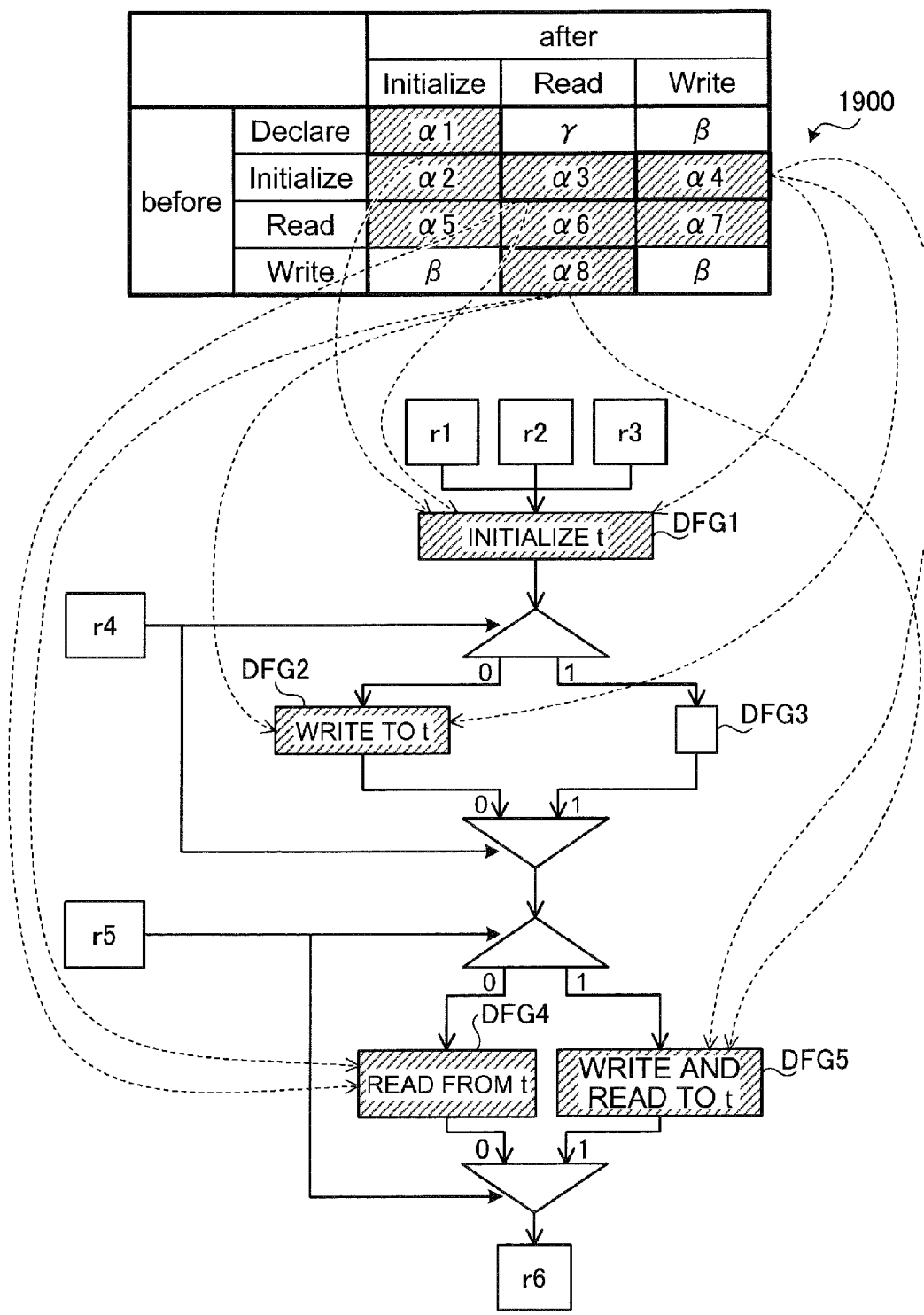
FIG. 19 is a diagram for explaining extraction of normal paths.

Finally, extraction of normal paths ($\alpha$) will be explained. FIG. 19 is a diagram for explaining extraction of normal paths. As depicted in a true value table 1900 of FIG. 19, eight paths other than the above four paths are normal paths ($\gamma$1 and $\beta$1 to $\beta$3). Out of the eight paths, the DFG1 has Declare→Initialize ($\alpha$1) Initialize→Read ($\alpha$3), and Initialize→Write ($\alpha$4).

In addition, the DFG2 has Initialize→Write ($\alpha$4) and Write→Read ($\alpha$7). The DFG4 has Initialize→Read ($\alpha$3) and Write→Read ($\alpha$8). The DFG5 has Initialize→Write ($\alpha$4) and Read→Write ($\alpha$8). These paths are extracted as normal paths ($\alpha$). Further, as with the paths $\beta$, the state transitions indicative of the extracted paths have dedicated flags set so as to be differentiated from the other state transitions.

As stated above, at step S703, all paths in a register as a verification target (the internal register t in the above example) can be detected using the DIRW matrix. At step S703, it is determined whether all the registers are processed, and thus path extraction at step S703 is sequentially carried out on all registers as verification targets. Accordingly, in the verification target circuit 100, there exist registers other than the internal register t (e.g. the internal register L and the implement-depending register "?"), and therefore the foregoing path extraction is also carried out on these other registers.

Further, at step S703, it is possible to generate an assertion for checking if a corresponding state transition has occurred actually at execution of a simulation. Specifically, such an assertion is a condition for creation of a state transition by a relevant path. This condition can be generated with reference to a description of a corresponding register in data constituting a CDFG.

For example, if data constituting a CDFG has a description in a PSL language, assertions described below are generated:
D (Declare)→I (Initialize)
assert always (~RESET|=>t=0) @ (PposegeCLK)
I (Initialize)→R (Read)
assert always (r4==0|=>r5==1) abort (RESET) @ (PposegeCLK)

These generated assertions are output at a time when the implementation coverage standard is decided at step S704 described later. FIG. 20 is a graphical chart of an output example of a marked DIRW matrix. By the path extraction at step S703, flags are set for the state transitions corresponding to the extracted paths. Therefore, after execution of step S703, the DIRW matrix is output as a data group with a mark indicating the presence of implementation (yes) like a graphical chart 2000. If such assertions as stated above are generated, the assertions are also contained in the data group.

At step S704, two coverage standards, the matrix coverage standard and the implementation coverage standard, are decided under instructions from a user of the verification support system 500 or a high-order system of the same. In deciding the matrix coverage standard, all the state transitions set in the first acquired DIRW matrix are included in the standard. Therefore, the matrix coverage standard includes 12 state transitions as depicted in the shaded sections of FIG. 3.

Meanwhile, in deciding the implementation coverage standard, a path extraction result from step S703 is utilized. FIGS. 21 and 22 are graphical charts of generation examples of the implementation coverage standard. At step S704, as depicted in shaded sections of a graphical chart 2100 of FIG. 21, a parent population including state transitions with the presence of implementation (yes) is decided as coverage standard. The decided coverage standard constitutes an implementation standard. Therefore, the implementation coverage standard includes four state transitions as depicted in the shaded sections of FIG. 4.

If assertions are generated at step S703, a higher-accuracy implementation coverage standard may be decided in consideration of the assertions. A plurality of assertions may be generated in one state transition. Therefore, each of the assertions is considered even in the same state transition, as depicted in shaded sections of a graphical chart 2200 of FIG. 22. Therefore, the decided implementation coverage standard in consideration of the assertions includes an aggregation of six state transitions+assertions. If an external device carries out execution of a verification simulation and calculation of verification coverage, the verification support system 500 may terminate a series of steps upon completion of output of the decided coverage standard.

Finally, verification coverage is calculated using the coverage standard decided at step S704. For example, in using the matrix coverage standard, all the 12 state transitions depicted in FIG. 3 are verified as simulation patterns. A coverage ratio of the verification with a parent population of the 12 patterns is calculated (the number of verified patterns/12 patterns), and a calculation result is output as verification coverage. Similarly, in using the implementation coverage standard, all of the four state transitions depicted in FIG. 4 are verified as simulation patterns. An equation for calculating a coverage ratio is (the number of verified patterns/four patterns) in general, and an equation in consideration of assertions is (the number of verified patterns/six patterns). A calculation result is also output as verification coverage.

According to this embodiment as explained above, at a first stage, simulation patterns can be limited to state transitions possibly occurring in the verification target circuit 100, by using the DIRW matrix in determining a coverage standard. This process considerably narrows down an almost infinite number of patterns and decreases a value of a denominator in calculating verification coverage, without any path omission. Using such a coverage standard shortens drastically a time for calculating verification coverage.

In addition, at a second stage, a coverage standard is determined on the basis of the state transitions possibly occurring in an implemented register, out of the state transitions set in the DIRW matrix. Therefore, it is possible to efficiently extract only the state transitions generated by paths requiring verification.

Next, another embodiment in which a plurality of verification scenarios is continuously executed will be explained. In the verification target circuit of the foregoing embodiment, it is possible to extract sufficient paths as verification targets by one execution of the verification scenario 900 as depicted in FIG. 9.

However, sufficient verification target paths may not be extracted depending on contents of an RTL description of the verification target circuit. Thus, in this embodiment, a verification scenario is continuously executed to extract any path that could not be extracted by one execution. Here, one verification scenario or different verification scenarios may be continuously executed.

For example, two consecutive executions of one verification scenario will be explained below. FIG. 23 is a diagram for explaining a description example of the verification scenario to be continuously executed. FIG. 24 is a diagram for explaining a description example (2) of an RTL description. A verification scenario 2300 in FIG. 23 indicates two consecutive executions of a process in an RTL description 2400 depicted in FIG. 24. A second-time scenario indicates a relationship between output of a first-time scenario and input of the second-time scenario.

Figure 25:
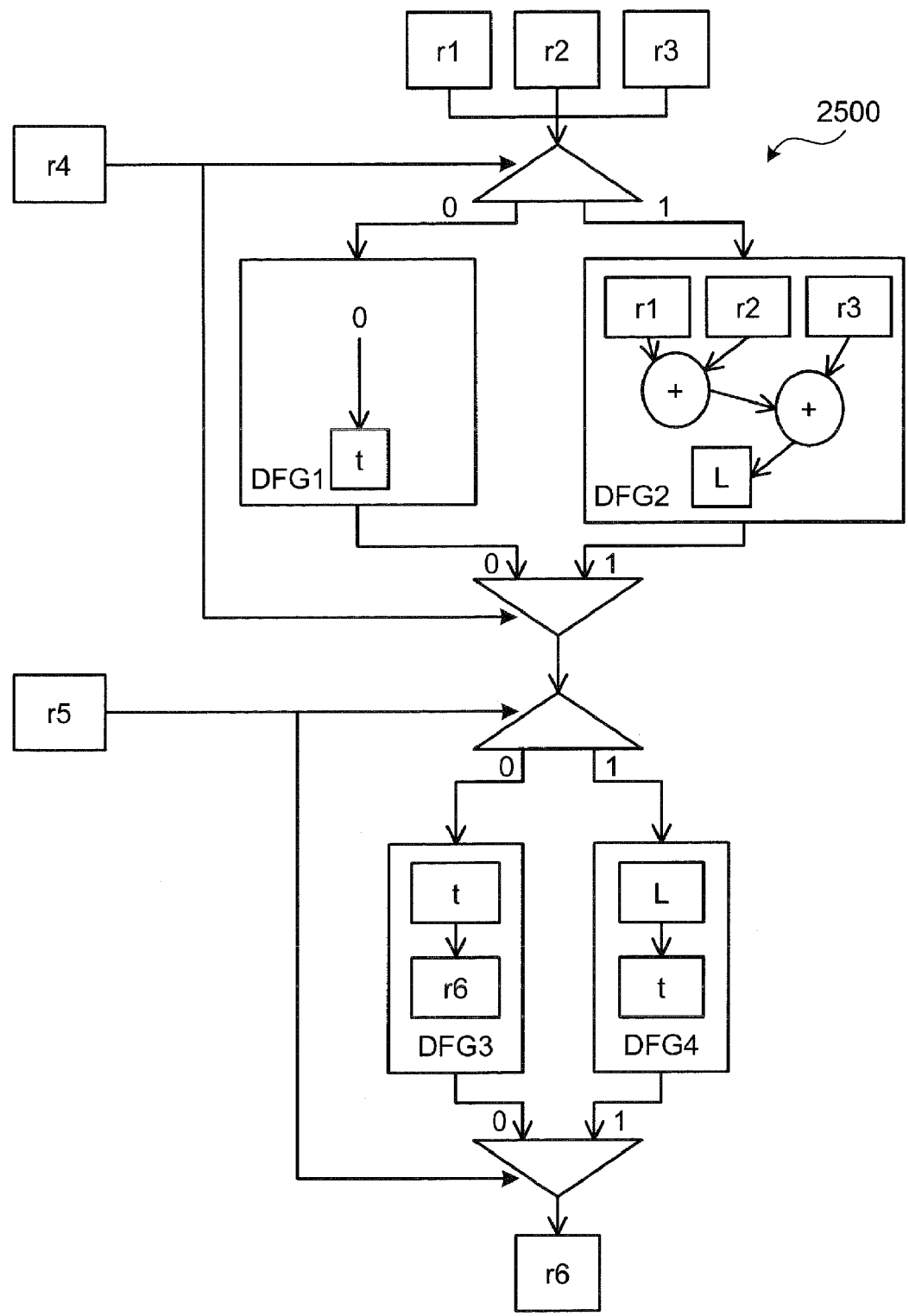
FIG. 25 is a circuit diagram of a CDFG configuration example using a continuous verification scenario.

FIG. 25 is a circuit diagram of a CDFG configuration example using the continuous verification scenario. According to the RTL description 2400 depicted in FIG. 24, a CDFG 2500 is generated as depicted in FIG. 25. The overall CDFG 2500 corresponds to the description 2401 in FIG. 24. With regard to DFGs constituting the CDFG 2500, the DFG1 corresponds to the description 2402 in FIG. 24, the DFG2 to the description 2403, the DFG3 to the description 2404, and the DFG4 to the description 2405, respectively.

In the first-time scenario, parameters are assigned to r1 to r5 and a value of r6 is read. In the second-time scenario, the value of r6 determined by a process in the first-time scenario is assigned to r1, and values of r2 and r3 are assigned again to r2 and r3. The second-time scenario is executed by carrying out again the process of the CDFG 2500 using the settings of r1 to r3.

Figure 26:
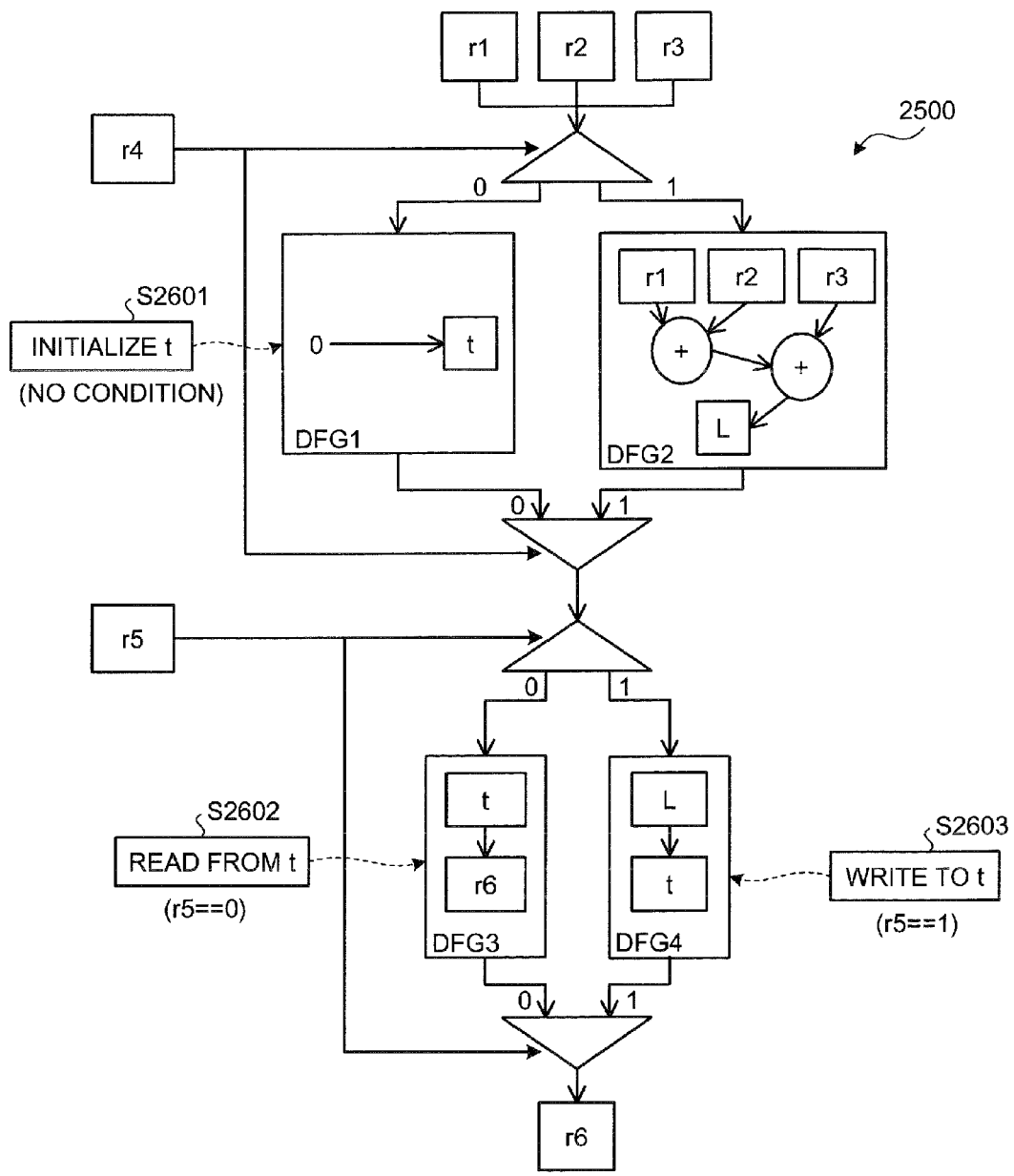
FIG. 26 is a diagram for explaining a path extraction process in relation to an internal register t using a continuous verification scenario.

Similarly in this embodiment, paths in relation to a register as a verification target are extracted from the continuous verification scenario. Assuming that the internal register t is a verification target register, FIG. 26 is a diagram for explaining a path extraction process in relation to the internal register t using the continuous verification scenario. As depicted in FIG. 26, the CDFG 2500 has three sections, DFG1, DFG3, and DFG4, at which the internal register t is used. Therefore, paths in relation to the internal register t in the four DFGs are extracted to see what transitions take place. Specifically, the following paths in relation to the internal register t are extracted:

Path to initialize t of 0 in the DFG1 (step S2601)
Path to read from t to r6 in the DFG3 (step S2603)
Path to write from L to t in the DFG4 (step S2603).

The internal register t has conditions in the DFG1, DFG3, and DFG4, according to the RTL description 1100. For example, the DFG1 has no condition according to the description 2402, and the DFG3 has a condition under which a value of r5 is set at 0 according to the description 2404.

Figure 27:
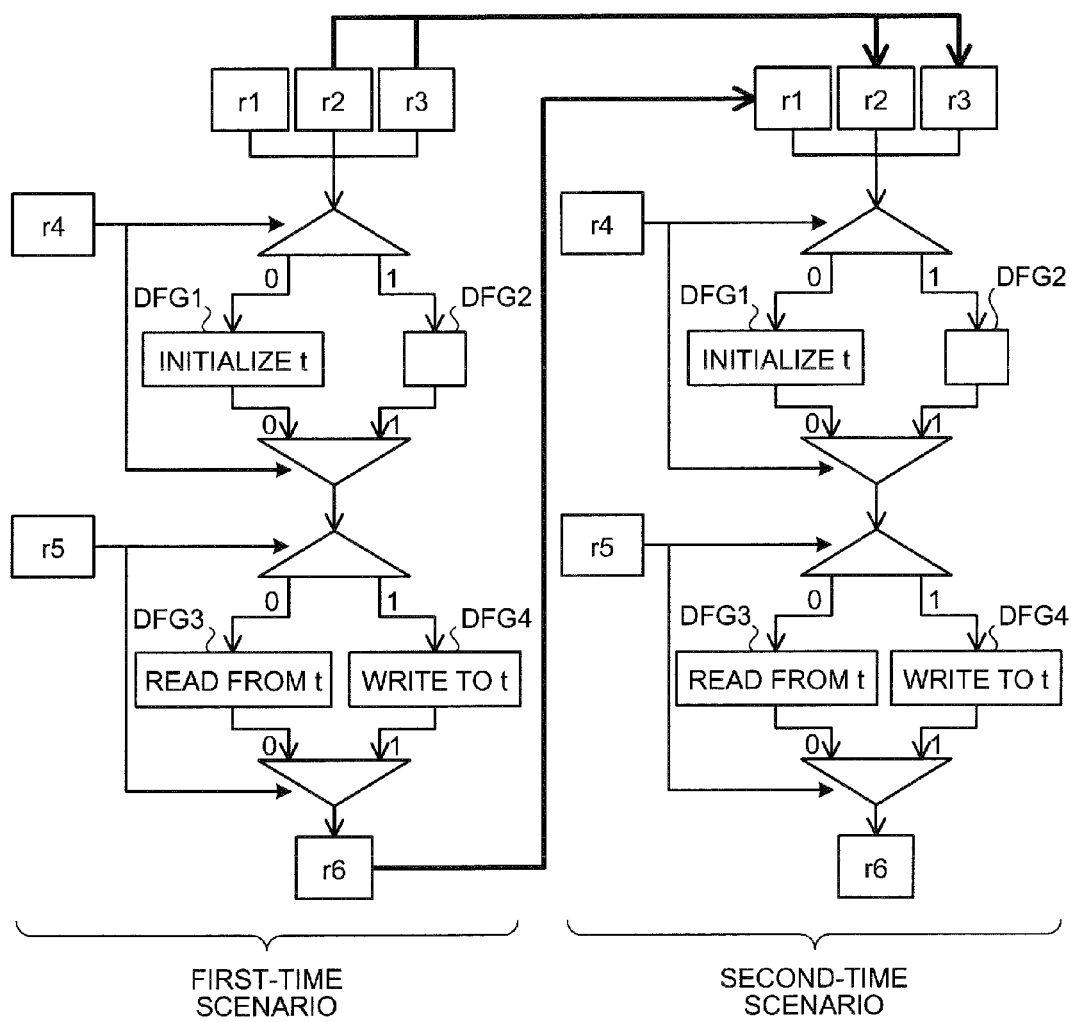
FIG. 27 is a diagram for explaining a generation example of continuous paths according to a continuous verification scenario.

In this embodiment, the CDFG 2500 is executed again using the value of r6, and thus paths in relation to the internal register t are also extracted from the second-time CDFG 2500. FIG. 27 is a diagram for explaining a generation example of continuous paths according to the continuous verification scenario. Under the verification scenario 2300 of FIG. 23, after execution of the first-time scenario as depicted in FIG. 27, the second-time scenario is executed with the use of r6 resulting from the execution of the first-time scenario to thereby generate the continuous paths. As with the first-time scenario, paths in relation to the internal register t are extracted from the DFG1, DFG3, and DFG4 under the second-time scenario.

Figure 28:
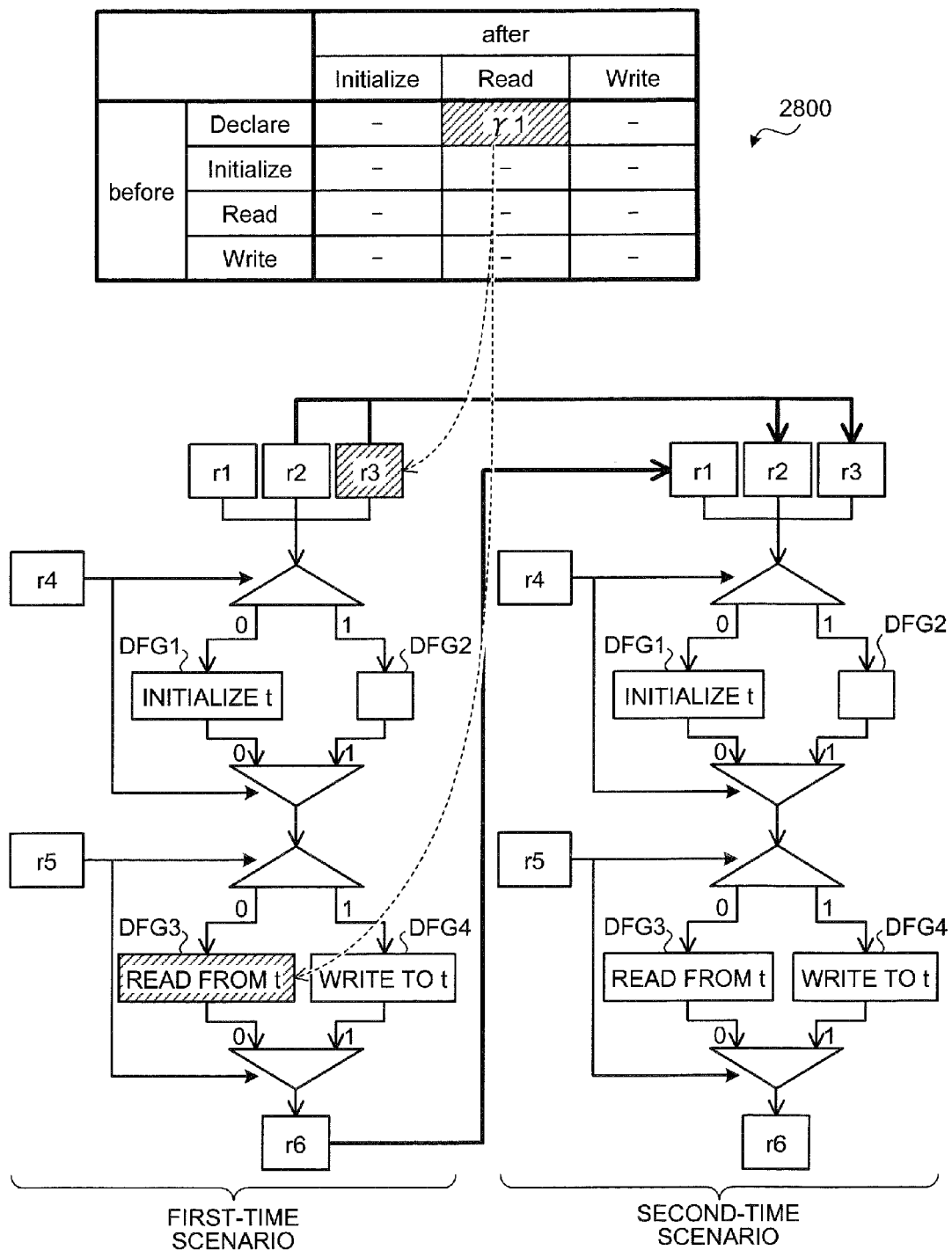
FIG. 28 is a diagram for explaining extraction of a path generating a bug under a continuous verification scenario.

Next, the paths extracted as stated above are further extracted according to path classification (α, β, and γ) under the DIRW matrix. First, extraction of a path generating a bug (γ) will be explained. FIG. 28 is a diagram for explaining extraction of a path generating a bug under the continuous verification scenario. As depicted in a true value table 2800 of FIG. 28, there exists a path generating a bug, Declare-Read (γ1). In addition, the verification target circuit has a path generating the state transition of Declare-Read in relation to the internal register t, in r3 and DFG3 at execution of the first-time scenario. Therefore, the state transition representing the path extracted as an implemented path has a dedicated flag set so as to be differentiated from the other state transitions. Incidentally, with regard to the state transition representing the path extracted at execution of the first-time scenario, there is no need for extraction at execution of the second-time scenario, and thus no path is extracted from the DFG3 under the second-time scenario.

Figure 29:
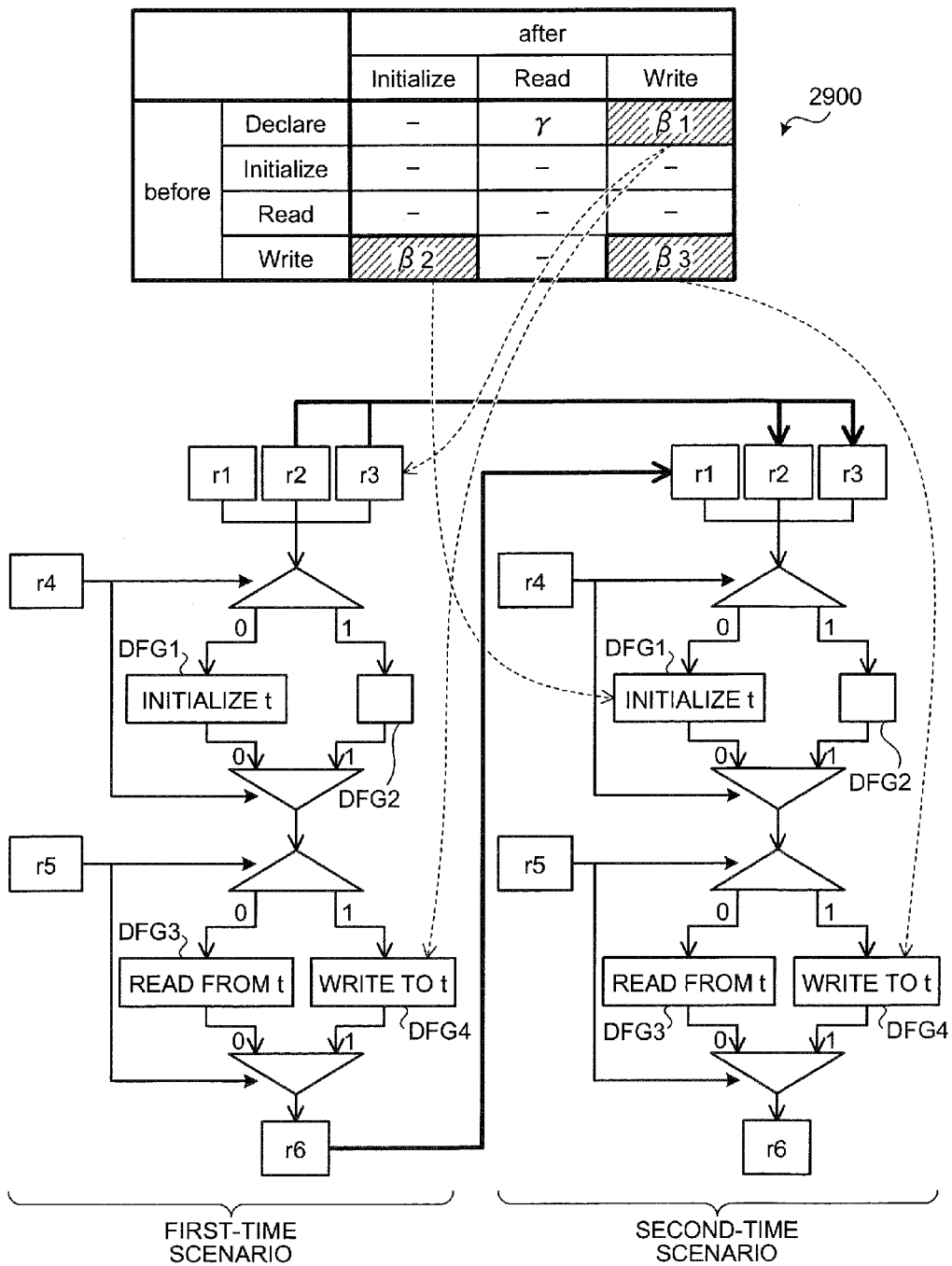
FIG. 29 is a diagram for explaining extraction of paths requiring a check under a continuous verification scenario.

Next, extraction of paths requiring a check for design intent (β) will be explained. FIG. 29 is a diagram for explaining extraction of paths requiring a check under the continuous verification scenario. As depicted in a true value table 2900 of FIG. 29, there exist paths requiring a check, Declare→Write (β1), Write→Initialize (β2), and Write→Write (β3).

Out of the three paths, the path of Declare→Write (β1) can be extracted from r3 and DFG4 under the first-time scenario. In addition, the path of Write→Initialize (β2) can be extracted from DFG1 under the second-time scenario. The path of Write→Write (β3) can be extracted from DFG4 under the second-time scenario. Similarly, the state transitions indicative of the extracted paths have dedicated flags set so as to be differentiated from the other state transitions. Out of the paths requiring a check for design intent (β), the paths of Write→Initialize (β2) and Write→Write (β3) do not appear at execution of the first-time scenario, and become capable of being extracted only by executing the second-time scenario as in this embodiment.

Figure 30:
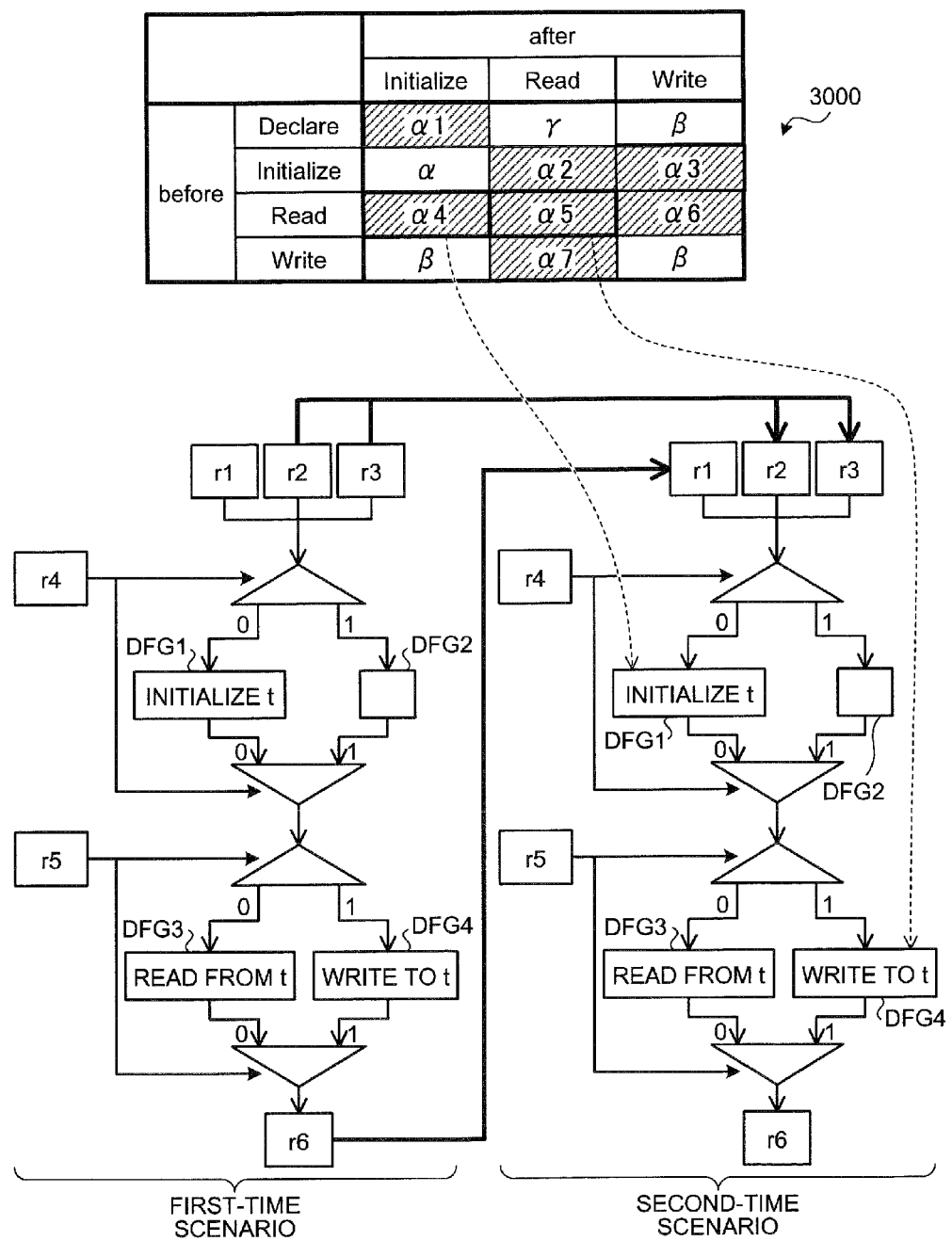
FIG. 30 is a diagram for explaining extraction of normal paths under a continuous verification scenario.

Finally, extraction of normal paths (α) will be explained. FIG. 30 is a diagram for explaining extraction of normal paths under the continuous verification scenario. FIG. 30 is a diagram for explaining extraction of normal paths. As depicted in a true value table 3000 of FIG. 30, eight paths other than the above four paths are normal paths (γ1 and β1 to β3). In this embodiment, out of the eight normal paths (α), all except for the path of Initialize→Initialize (α1 to α7) can be extracted by executing the first- and second-time scenarios.

Out of the paths α1 to α7, α4 and α5 in particular are paths that can be extracted only by executing the second-time scenario. That is, as depicted in FIG. 30, Read→Initialize (α4) is extracted from the DFG1 under the second-time scenario, and Read→Read (α5) is extracted from the DFG4 under the second-time scenario. The other normal paths (α1 to α3, α6, and α7) can be extracted under the first-time scenario and thus description thereof will be omitted here. With regard to the extracted paths a1 to a7, the state transitions representing the extracted paths, out of the state transitions set in the DIRW matrix, have flags set to be differentiated from the other state transitions.

After extraction of the implemented paths in relation to the internal register t, the process moves to a step of generating an implementation coverage standard. FIG. 31 is a graphical chart of an output example of a marked DIRW matrix under the continuous verification scenario. By the path extraction, flags are set on the state transitions corresponding to the extracted paths. Therefore, after step S703, the DIRW matrix is output as a data group with a mark indicating the presence of implementation (yes) like a graphical chart 3100. If assertions are generated to check occurrence of state transitions indicated by the extracted paths, the assertions are included in the data group.

FIGS. 32 and 33 are graphical charts of a generation example of an implementation coverage standard under the continuous verification scenario. As depicted in shaded sections of a graphical chart 3100 of FIG. 32, a parent population including state transitions with the presence of implementation (yes) is decided as a coverage standard. The decided coverage standard constitutes an implementation coverage standard. Therefore, the implementation coverage standard has 11 state transitions as a denominator.

In FIG. 33, state transitions in consideration of the assertions as depicted in shaded sections of the graphical chart 3100 constitute an implementation coverage standard. Therefore, this implementation coverage standard is higher in accuracy with 13 state transitions as a denominator. The generated implementation coverage standard as depicted in FIG. 32 or 33 is used to calculate verification coverage. The calculation of verification coverage is performed in the same manner as that in step S705 of FIG. 7, and thus a description thereof will be omitted here.

In addition, parameters for execution of a verification scenario can be calculated using a result of the path extraction process. Specifically, values possibly assigned as parameters to the verification scenario can be calculated with reference to the CDFG 2500 and the implemented paths corresponding to the extracted DIRW.

The following values may be assigned to the extracted paths α, β, and γ as depicted in FIGS. 28 to 30:

Path γ
Declare→Read: r4=1, r5=0 (first time)
Paths β
Declare→Write: r4=1, r5=1 (first time)
Write→Initialize: r5=1 (first time), r4=0 (second time)
Write→Write: r4=1 (first time), r4=1, r5=1 (second time)
Paths α
Declare→Initialize: r4=0 (first time)
Initialize→Read: r4=0, r5=0 (first time), r4=0, r5=0 (second time)
Initialize→Write: r4=0, r5=1 (first time), r4=0, r5=1 (second time)
Read→Initialize: r5=1 (first time), r4=0 (second time)
Read→Read: r5=0 (first time), r4=1, r5=0 (second time)
Read→Write: r5=0 (first time), r4=1, r5=1 (second time)
Write→Read: r5=0 (first time), r4=1, r5=0 (second time).
Unassigned parameters can take arbitrary values.

In calculating parameters, with regard to assignment of the above values, possibly input values are determined. As a matter of course, calculation of parameters may become complicated depending on the number of verification target paths, but the calculation can be easily carried out using a solver or an existing computing application such as Mathematica.

FIG. 34 is a graphical chart of an output example of a verification scenario with parameters. The values determined by the foregoing process can be assigned to the parameters of the verification scenario to thereby output a parameter value-assigned verification scenario 3400 as depicted in FIG. 34. By generating a verification scenario with parameters as stated above, the verification scenario can be efficiently executed.

As stated above, if sufficient paths are not extracted by only one execution of a verification scenario, paths that remain not extracted can be extracted by continuously executing a plurality of verification scenarios. Depending on a configuration of the verification target circuit, sufficient paths may be extracted by only one execution of a verification scenario or may be extracted by three executions of a verification scenario. In addition, an extraction result varies depending on the used verification scenario. Therefore, a user may use various simulation tools in advance to determine what verification scenario to be employed for efficient operation, or may decide in advance kind of a verification scenario and number of executions of the verification scenario in appropriate combinations.

As explained above, in the verification support process of this embodiment, verification coverage is determined using an efficiently determined coverage standard, which results in highly reliable verification information. Therefore, using such verification coverage can increase an accuracy of verification with respect to a verification target register.

The verification support method explained in relation to this embodiment can be realized by executing a program prepared on a computer such as a personal computer or a work station. This program is recoded in a computer-readable recording medium such as a hard disk, flexible disk, CD-ROM, MO, or DVD, and read from the recording medium and executed by the computer. In addition, this program may be a medium capable of being distributed via a network such as the Internet.

The verification support system 500 explained in relation to the embodiments can be realized by an application specific IC such as a standard cell or a structured application specific integrated circuit (ASIC), or by a programmable logic device (PLD) such as an FPGA. Specifically, the verification support system 500 can be produced by defining the functions of the verification support system 500 (the acquiring unit 602 to the calculating unit 609) in an HDL description, logically synthesizing the HDL description, and providing the same to an ASIC or PLD, for example.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment(s) of the present inventions have been described in detail, it should be understood that the various changes, substitutions, and alterations could be made hereto without departing from the spirit and scope of the invention.

What is claimed is:

1. A non-transitory computer-readable recording medium storing a program causing a computer to perform:
    recording a DIRW matrix containing: possibly occurring state transitions among four states, Declare, Initialize, Read, and Write in a register included in a verification target circuit; and information about validity of paths according to the state transitions; and
    extracting, when an arbitrary register in the verification target circuit is designated as a verification target register, all the state transitions contained in the DIRW matrix, as a parent population in calculating verification coverage of the verification target register.

2. A verification supporting apparatus, comprising:
    a recording unit that records a DIRW matrix containing: possibly occurring state transitions among four states, Declare, Initialize, Read, and Write, in a register included in a verification target circuit; and information on validity of paths according to the state transitions; and
    a deciding unit that, when an arbitrary register in the verification target circuit is designated as a verification target register, decides all the state transitions recorded in the recording unit as a coverage standard constituting a parent population in calculating verification coverage of the verification target register.

3. A computer implemented verification supporting method, comprising:
    recording by processor a DIRW matrix containing: possibly occurring state transitions among four states, Declare, Initialize, Read, and Write in a register included in a verification target circuit; and information about validity of paths according to the state transitions; and
    extracting by processor, when an arbitrary register in the verification target circuit is designated as a verification target register, all the state transitions contained in the DIRW matrix, as a parent population in calculating verification coverage of the verification target register.

* * * * *